(12) United States Patent
Hozumi

(10) Patent No.: US 11,997,958 B2
(45) Date of Patent: Jun. 4, 2024

(54) TECHNIQUE TO IMPROVE WATERPROOFNESS AND DUST RESISTANCE FOR CIRCUIT BOARD IN JOB-SITE GEAR

(71) Applicant: MAKITA CORPORATION, Anjo (JP)

(72) Inventor: Akihiro Hozumi, Anjo (JP)

(73) Assignee: MAKITA CORPORATION, Anjo (JP)

(*) Notice: Subject to any disclaimer, the term of this patent is extended or adjusted under 35 U.S.C. 154(b) by 215 days.

(21) Appl. No.: 17/497,601

(22) Filed: Oct. 8, 2021

(65) Prior Publication Data
US 2022/0110273 A1 Apr. 14, 2022

(30) Foreign Application Priority Data
Oct. 12, 2020 (JP) .................................. 2020-171929

(51) Int. Cl.
*A01G 20/47* (2018.01)
*A01D 34/90* (2006.01)
(Continued)

(52) U.S. Cl.
CPC ............ *A01G 20/47* (2018.02); *A01D 34/90* (2013.01); *A47L 5/36* (2013.01); *F16M 13/04* (2013.01);
(Continued)

(58) Field of Classification Search
CPC . H01L 2224/48091; H01L 2924/13055; H01L 2224/73265; H01L 2924/13091;
(Continued)

(56) References Cited

U.S. PATENT DOCUMENTS 3,867,672 A * 2/1975 Pizzigoni ............. H05K 7/1015
439/70
4,032,706 A * 6/1977 Paletto .................... H01L 24/97
257/E23.044
(Continued)

FOREIGN PATENT DOCUMENTS

JP    2007-194577 A    8/2007
JP    2020-093343 A    6/2020

OTHER PUBLICATIONS

Mar. 26, 2024 Office Action issued in Japanese Application No. 2020-171929.

*Primary Examiner* — Michael A Matey
(74) *Attorney, Agent, or Firm* — Oliff PLC

(57) ABSTRACT

A job-site gear in one aspect of the present disclosure includes a circuit board, at least one electronic component, and a resin member. A first surface of the circuit board includes a first area, a second area, and a third area. The third area is located in a boundary between the first area and the second area. A second surface of the circuit board includes a fourth area, a fifth area, and a sixth area located behind the first area, the second area, and the third area, respectively. The third area and the sixth area include at least one slit penetrating through the circuit board. The resin member is integrally molded so as to (i) penetrate through the at least one slit and (ii) cover the first area, the fourth area, and a part of the at least one electronic component on the first area.

14 Claims, 16 Drawing Sheets

(51) Int. Cl.
  *A47L 5/36* (2006.01)
  *F16M 13/04* (2006.01)
  *H05K 5/00* (2006.01)
  *H05K 3/34* (2006.01)
(52) U.S. Cl.
  CPC ..... *H05K 5/0034* (2013.01); *A01D 2034/907* (2013.01); *H05K 3/3447* (2013.01); *H05K 2201/1056* (2013.01)
(58) Field of Classification Search
  CPC ......... H01L 2924/14; H01L 2924/1305; H01L 2224/45015; H01L 2224/48139; H01L 23/4006; H01L 23/3107; H01L 23/055; H01L 23/057; H01L 23/49861; H05K 2201/10166; H05K 2201/1056; H05K 3/284; H05K 3/3447; H05K 7/2089; H05K 2203/167; H05K 5/0034; H05K 5/065; H05K 7/1432
  See application file for complete search history.

(56) References Cited

U.S. PATENT DOCUMENTS

| | | | | |
|---|---|---|---|---|
| 4,107,727 A * | 8/1978 | Ikezawa | ............. | H01L 23/3121 257/E23.125 |
| 4,326,215 A * | 4/1982 | Suzuki | ............... | H01L 23/3121 257/E23.125 |
| 5,229,918 A * | 7/1993 | Della Bosca | ....... | H01L 23/4334 174/16.3 |
| 5,296,999 A * | 3/1994 | Taruya | ..................... | F02P 3/02 361/247 |
| 5,558,074 A * | 9/1996 | Fukatsu | .................. | H01F 38/12 123/647 |
| 6,257,215 B1 * | 7/2001 | Kaminaga | ......... | H01L 23/49562 123/634 |
| 7,500,880 B1 * | 3/2009 | Vaziri | ................. | H04M 1/0289 439/717 |
| 8,472,196 B2 * | 6/2013 | Zeng | ................. | H01L 23/49562 257/676 |
| 2005/0281009 A1 * | 12/2005 | Sasaki | .................... | H05K 5/065 361/752 |
| 2006/0244116 A1 * | 11/2006 | Tsunoda | .................. | H01L 24/37 257/E21.515 |
| 2007/0206365 A1 * | 9/2007 | Shiu | ..................... | H05K 5/0278 361/752 |
| 2009/0057006 A1 * | 3/2009 | Kishibata | ............... | H05K 3/284 29/841 |
| 2009/0201399 A1 * | 8/2009 | Senga | .................. | H04N 23/685 348/374 |
| 2009/0277684 A1 | 11/2009 | Takahashi et al. | | |
| 2010/0254093 A1 * | 10/2010 | Oota | .................... | B60R 16/0239 361/720 |
| 2014/0254103 A1 * | 9/2014 | Yoshimi | ............... | H05K 7/2089 361/719 |
| 2015/0009629 A1 * | 1/2015 | Moon | ...................... | H05K 5/06 29/842 |
| 2015/0189794 A1 * | 7/2015 | Tashima | ............... | H05K 7/1432 361/720 |
| 2017/0257964 A1 * | 9/2017 | Ishikawa | ............... | H05K 5/0047 |
| 2017/0325341 A1 * | 11/2017 | Ogane | ..................... | H01L 25/50 |
| 2017/0353084 A1 * | 12/2017 | Kashihara | ................ | H02K 5/24 |
| 2018/0220539 A1 * | 8/2018 | Kaneko | ................ | H05K 7/20409 |
| 2019/0373750 A1 * | 12/2019 | Omote | .................. | H05K 7/1417 |
| 2020/0187415 A1 | 6/2020 | Hozumi | | |

\* cited by examiner

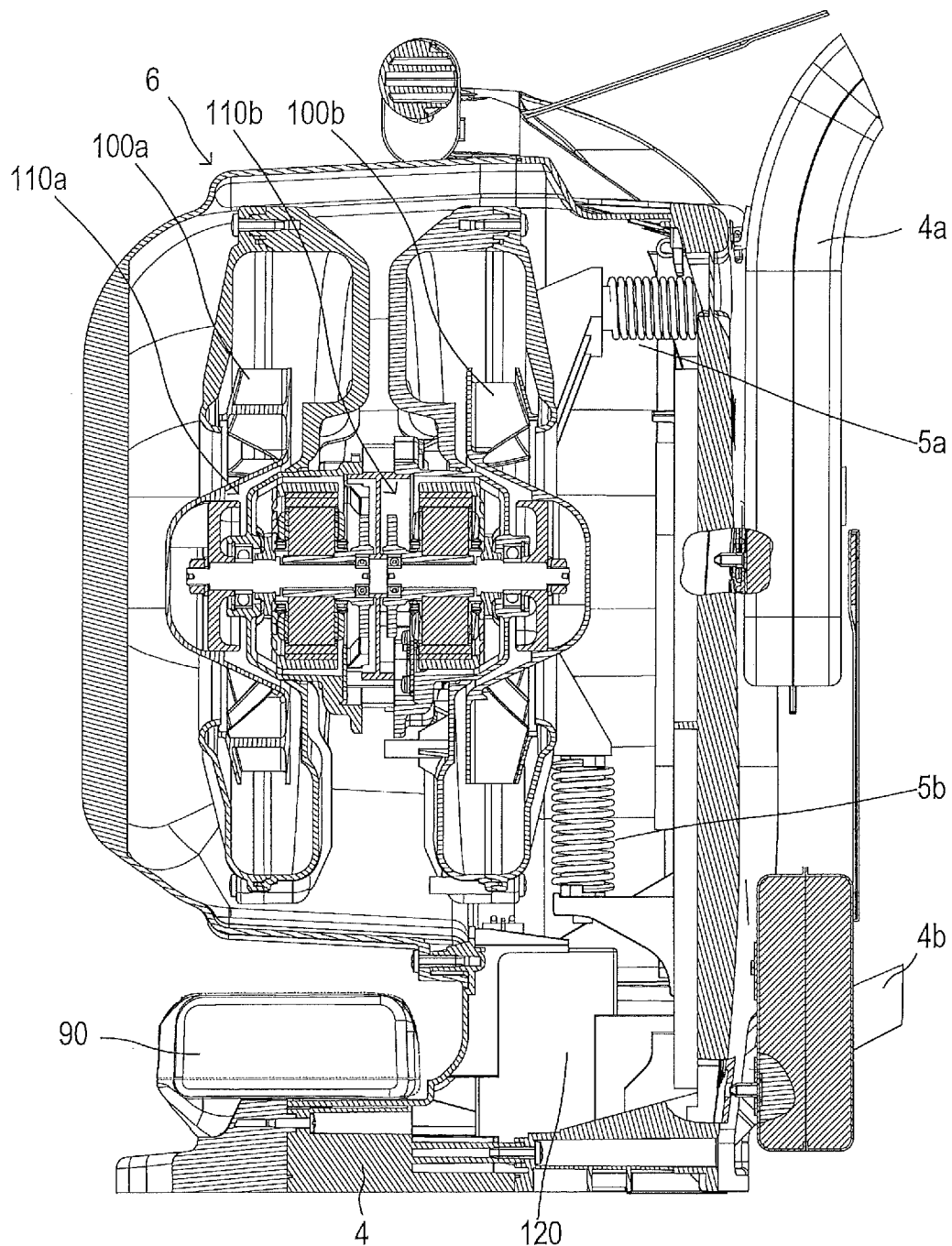
FIG. 2
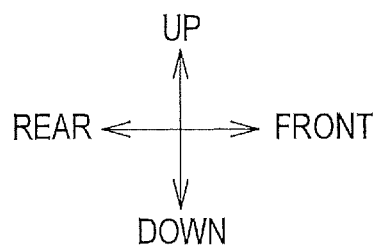

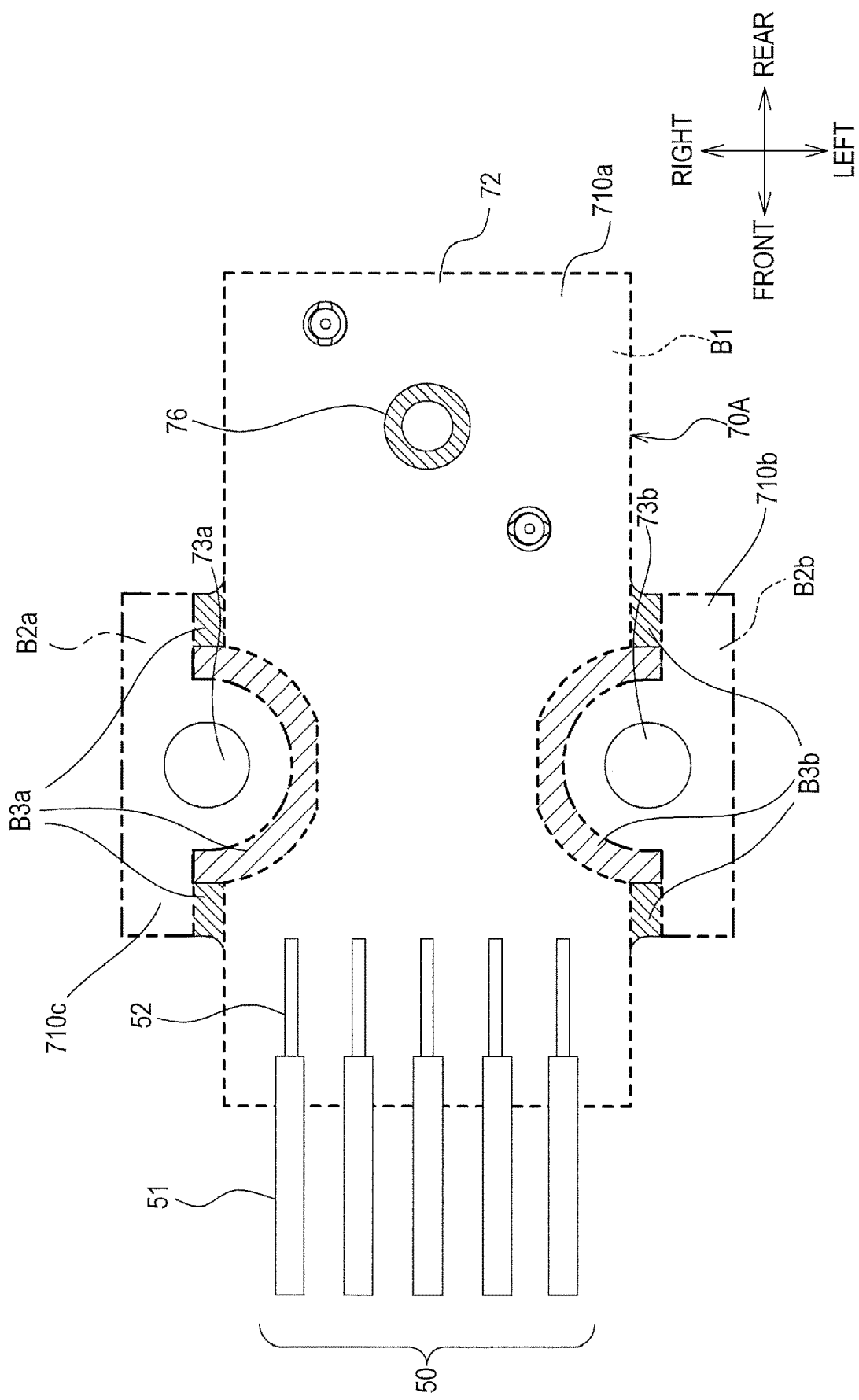

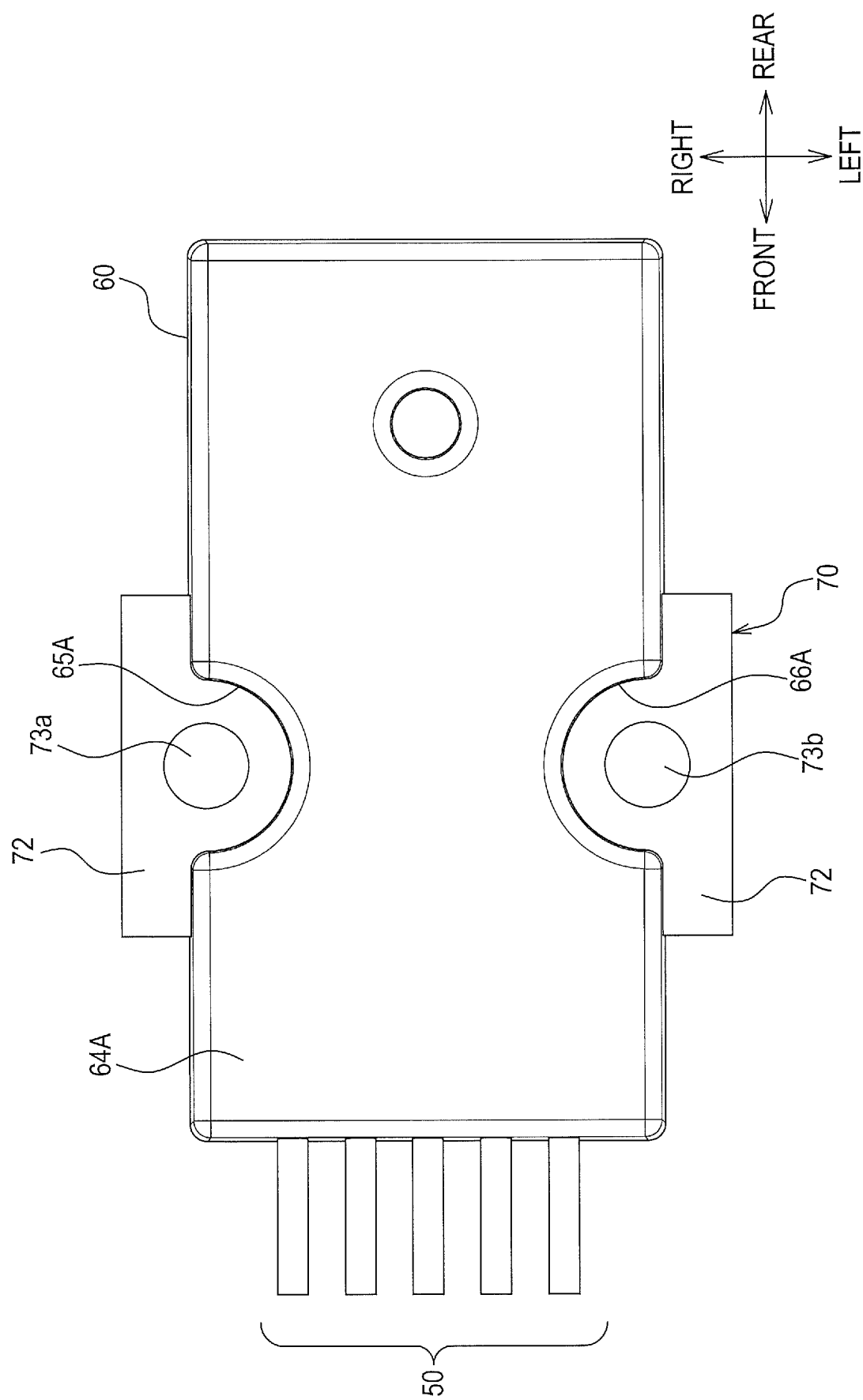

TECHNIQUE TO IMPROVE WATERPROOFNESS AND DUST RESISTANCE FOR CIRCUIT BOARD IN JOB-SITE GEAR

CROSS-REFERENCE TO RELATED APPLICATIONS

The present application claims the benefit of Japanese patent application No. 2020-171929 filed with the Japan Patent Office on Oct. 12, 2020, and the entire disclosure of which is incorporated herein by reference.

BACKGROUND

The present disclosure relates to a job-site gear.

JP 2020-093343A discloses a work machine including an indicator. This indicator includes a circuit board, an LED, a lens and a lead wire. The LED and the lens are placed on the top surface of the circuit board, and the lens covers the LED. The lead wire is placed on the bottom surface of the circuit board to supply an electric current to the LED. The periphery of the lens and the lead wire are covered with an integrally-molded resin member. With this resin member, liquid such as water is less likely to go inside the lens, thus the waterproofness of the indicator is improved.

SUMMARY

The integrally-molded resin member is formed by injecting resin into a mold and hardening the injected resin. The resin member does not cover a part of the circuit board holding the circuit board in the mold. Therefore, this part of the circuit board protrudes from the resin member. In a boundary between this protruding part and the resin member, a gap may be generated by thermal contraction of the resin member. If many gaps are generated along the boundary, the liquid and the dust may enter into a portion of the circuit board covered with the resin member.

In one aspect of the present disclosure, it is desirable to improve the waterproofness and the dust resistance for a circuit board in a job-site gear.

One aspect of the present disclosure provides a job-site gear (or a job-site tool, job-site equipment or a work machine). The job-site gear includes a circuit board, at least one electronic component, and a resin member. The circuit board has a first surface and a second surface. The first surface includes a first area (or region), a second area, and a third area. The third area is located in a boundary between the first area and the second area. The second surface is located behind the first surface. The second surface includes a fourth area, a fifth area, and a sixth area. The fourth area, the fifth area, and the sixth area are located behind the first area, the second area, and the third area, respectively. The third area and the sixth area include at least one slit penetrating through the circuit board. The at least one electronic component is mounted on the first area. The resin member is integrally molded so as to (i) penetrate (or extend) through the at least one slit and (ii) cover the first area, the fourth area, and a part of the at least one electronic component.

As mentioned above, this job-site gear includes the resin member penetrating through the at least one slit, which reduces a boundary between the resin member and the circuit board. Therefore, the waterproofness and the dust resistance for the circuit board in the job-site gear can be improved.

The fourth area, the fifth area, and the sixth area may be congruent with the first area, the second area, and the third area, respectively.

The second area and the fifth area may include at least one screw hole penetrating through the circuit board.

The at least one slit may have a semicircular arc shape.

The at least one such slit enables effective use of the second area to provide the at least one screw hole or others.

The second area and the fifth area may include at least one screw hole at a position corresponding to a center of the semicircular arc shape. The at least one screw hole may penetrate through the circuit board. In this case, the circuit board with the first area and the fourth area covered with the resin member can be smoothly screwed into another member without being blocked by the resin member.

The first surface may partially include a first resist formed on the first surface.

The second surface may partially include a second resist formed on the second surface.

The circuit board may include a first adhesive joint (i) that is formed in the third area and (ii) that does not include the first resist formed thereon. The circuit board may include a second adhesive joint (i) that is formed in the sixth area and (ii) that does not include the second resist formed thereon. The resin member may be adhered to the first adhesive joint and the second adhesive joint without interposing the first resist and the second resist therebetween.

In this case, the resin member is adhered to the first adhesive joint provided in the third area (i.e., the boundary between the first area and the second area) without interposing the first resist therebetween. In addition, the resin member is adhered to the second adhesive joint provided in the sixth area (i.e., the boundary between the fourth area and the fifth area) without interposing the second resist therebetween. Therefore, the adherence between the resin member and the first adhesive joint and the adherence between the resin member and the second adhesive joint are improved, which can further inhibit the liquid and the dust from entering into the first area and the fourth area.

The term "resist" in the present disclosure refers to a cover, a coating, or a layer that protects a surface of a circuit board from solder, dust, heat, humidity, and/or oxidation, and/or that insulates the surface of the circuit board, and the term covers a solder resist and a solder mask.

The circuit board may include a non-adjacent end that is not on (or not adjacent to) the third area. The resin member may include a proximal end to the non-adjacent end. The job-site gear may include a lead wire (i) that is electrically connected to the at least one electronic component, (ii) that has a part covered with the resin member, and (iii) that protrudes from the proximal end.

In such a job-site gear, the lead wire can be drawn from the circuit board while inhibiting the liquid and the dust from entering into the first area and the fourth area.

The circuit board may include a first quadrangle part having a first side part. The first quadrangle part may include the first area and the fourth area.

The circuit board may include a second quadrangle part extending along the first side part. The second quadrangle part may include the second area, the third area, the fifth area, and the sixth area.

The first quadrangle part may include a second side part. The circuit board may further include a third quadrangle part extending along the second side part.

The circuit board may have a cross shape.

The at least one electronic component may include a manual switch configured to be manually operated by a user of the job-site gear.

The manual switch may include a manually operated portion configured to be manually operated by the user. The manually operated portion may be exposed from the resin member.

The job-site gear may include a manual controller manually operated by the user. The circuit board and the resin member may be provided to the manual controller.

Examples of the job-site gear may include an electric power tool, a gardening tool, a laser marking device and a lighting. The electric power tool and the gardening tool correspond to a tool that drives a tip tool with a driving force of a motor. Examples of the electric power tool may include a chain saw, an impact driver, and a circular saw. Examples of the gardening tool may include a grass mower and a hedge trimmer. Examples of the electric power tool and the gardening tool may include a tool including an engine that generates a driving force to drive a tip tool, and a starter motor that generates a rotational force with a direct-current power from the battery to give an initial rotation to a crank shaft of the engine.

Another aspect of the present disclosure provides a method for manufacturing a job-site gear, the method including:
  providing a circuit board having a first surface and a second surface, the first surface including a first area, a second area, and a third area, the third area being located in a boundary between the first area and the second area, the second surface being located behind the first surface, the second surface including a fourth area, a fifth area, and a sixth area, and the fourth area, the fifth area, and the sixth area being located behind the first area, the second area, and the third area, respectively;
  mounting at least one electronic component on the first area;
  providing at least one slit in the third area and the sixth area, the at least one slit penetrating through the circuit board;
  integrally molding a resin member so that (i) the resin member penetrates through the at least one slit and (ii) the resin member covers the first area, the fourth area, and a part of the at least one electronic component; and
  providing to the job-site gear the circuit board having the resin member integrally molded therewith.

According to this method, the waterproofness and the dust resistance for the circuit board in the job-site gear can be improved.

The present disclosure further discloses the following items 1 to 8.

1. A job-site gear including:
  a circuit board having a first surface and a second surface, the first surface including a resist partially formed thereon, the first surface including a first area, a second area, and a third area, the third area being located in a boundary between the first area and the second area, the resist being removed from at least the third area, the second surface being located behind the first surface, and the second surface including a fourth area behind the first area;
  at least one electronic component mounted on the first area; and
  a resin member including a resin adhesive joint adhered to the third area, the resin member being integrally molded to cover the first area, the fourth area, and a part of the at least one electronic component.

In such a job-site gear, the first surface of the circuit board has the third area, from which the resist is removed, in the boundary between the first area and the second area. The resin member covers the first area, the fourth area, and a part of the at least one electronic component, and is adhered to the third area which is located between the first area and the second area and from which the resist is removed. As a result, in the edge of the resin member adjacent to the second area, the adherence between the resin member and the circuit board is improved, which can inhibit the liquid and the dust from reaching the at least one electronic component. Consequently, the waterproofness and the dust resistance for the job-site gear can be improved. The second surface may be entirely or partially provided with a resist thereon, or may be provided with no resist thereon.

2. The job-site gear according to item 1,
  wherein the third area includes a circular arc area having a shape of semicircular arc.

Since the third area includes the circular arc area, the second area can be effectively used to provide a screw hole or others.

3. The job-site gear according to item 2,
  wherein the second area includes at least one screw hole, and
  wherein a center of the semicircular arc corresponds to one of the at least one screw hole.

If the center of the semicircular arc corresponds to one of the at least one screw hole, the circuit board with the first area and the fourth area covered with the resin member can be smoothly screwed into another member without being blocked by the resin member.

4. The job-site gear according to item 2 or 3,
  wherein the circular arc area includes a first end and/or a second end,
  wherein the third area includes:
  a first quadrangle area extending from the first end to a first edge of the circuit board; and/or
  a second quadrangle area extending from the second end to a second edge of the circuit board.

If the third area includes the first quadrangle area and/or the second quadrangle area, the liquid and the dust can be further inhibited from entering from the first edge and/or the second edge of the circuit board into the inside of the resin member.

5. The job-site gear according to item 4,
  wherein a longitudinal direction of the first quadrangle area and/or a longitudinal direction of the second quadrangle area correspond/corresponds to a longitudinal direction of the circuit board.

With this configuration, the circuit board can be easily designed.

6. The job-site gear according to item 4 or 5,
  wherein the resin adhesive joint includes:
  a first resin adhesive joint adhered to the circular arc area; and
  a second resin adhesive joint adhered to the first quadrangle area and/or a third resin adhesive joint adhered to the second quadrangle area, and
  wherein the first resin adhesive joint and the second resin adhesive joint and/or the third resin adhesive joint are formed along an edge of the resin member.

If the first resin adhesive joint and the second resin adhesive joint and/or the third resin adhesive joint are formed in this way, the liquid and the dust can be preferably inhibited from entering from the second area into the inside of the resin member.

7. The job-site gear according to any one of items 1 to 6, wherein the circuit board includes a non-adjacent end that is not on (or not adjacent to) the third area,
wherein the resin member includes a proximal end to the non-adjacent end, and
wherein the job-site gear further includes a lead wire (i) that is electrically connected to the at least one electronic component, (ii) that has a portion covered with the resin member, and (iii) that protrudes from the proximal end.

In such a job-site gear, the lead wire can be drawn out from the circuit board while inhibiting the liquid and the dust from entering into the inside of the resin member.

8. A method for manufacturing a job-site gear, the method comprising:
providing a circuit board having a first surface and a second surface, the first surface including a first area, a second area, and a third area, the third area being located in a boundary between the first area and the second area, the second surface being located behind the first surface, and the second surface including a fourth area behind the first area;
partially providing a resist on the first surface except for at least the third area;
mounting at least one electronic component on the first area,
integrally molding a resin member so that (i) the resin member is adhered to the third area and (ii) the resin member covers the first area, the fourth area, and a part of the at least one electronic component; and
providing to the job-site gear the circuit board with the resin member integrally molded.

According to this method, the waterproofness and the dust resistance for the circuit board in the job-site gear can be improved.

BRIEF DESCRIPTION OF THE DRAWINGS

Example embodiments of the present disclosure will be described hereinafter by way of example with reference to the accompanying drawings, in which:

FIG. 2 is a sectional view of the backpack-type blower;

FIG. 15 is a plan view showing a lower surface of the circuit board according to the second embodiment; and FIG. 16 is a plan view showing the lower surface of the circuit board according to the second embodiment, the lower surface being covered with the resin member.

DETAILED DESCRIPTION OF EXEMPLARY EMBODIMENTS

First Embodiment 1-1. Overall Configuration

Figure 1:
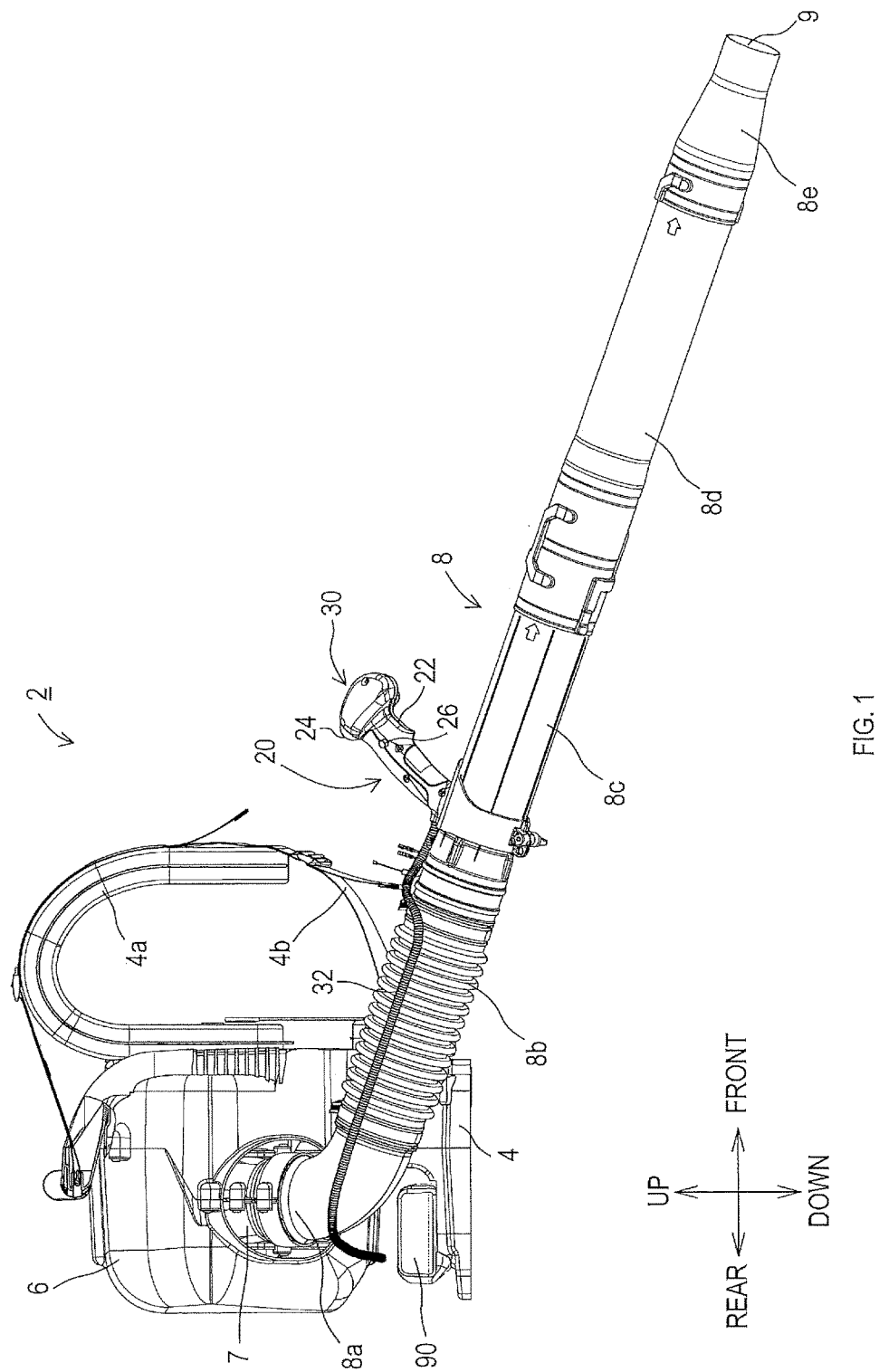
FIG. 1 is a perspective view showing an external appearance of a backpack-type blower of a first embodiment.

With reference to FIGS. 1 and 2, an overall configuration of a job-site gear 2 of a first embodiment will be described. In this first embodiment, the job-site gear 2 is in the form of a backpack-type blower (hereinafter, referred to as "blower 2").

The blower 2 includes a back carrier 4. The back carrier 4 includes shoulder pads 4a and belts 4b attached to the back carrier 4. The shoulder pads 4a are configured to be hung on shoulders of a user of the blower 2. The belts 4b are attached to the respective shoulder pads 4a and configured to be adjustable in their lengths so that the back carrier 4 fits for the user's upper body.

The blower 2 includes a blower main body 6. The blower main body 6 is fixed to the back carrier 4 through a first spring 5a and a second spring 5b, The first spring 5a and a second spring 5b are attached to the back carrier 4 to absorb vibrations of the blower main body 6. The blower main body 6 houses a first fan 100a, a second fan 100b, a first motor 110a, and a second motor 110b within the blower main body 6. The first motor 110a and the second motor 110b drive the first fan 100a and the second fan 100b, respectively.

The blower 2 includes at least one battery pack 90. The at least one battery pack 90 is fixed to the back carrier 4 on the bottom of the blower main body 6. The back carrier 4 also includes a driving controller 120 fixed thereto. The at least one battery pack 90 supplies electric power to the driving controller 120, the first motor 110a, the second motor 110b and a manual controller 30, which will be described below. The driving controller 120 controls the first motor 110a and the second motor 110b based on signals from the manual controller 30 and various switches, which will be described below.

The blower main body 6 includes a pipe attaching portion 7. When a user carries the back carrier 4 on the user's back, the pipe attaching portion 7 is located on the right side of the user. The pipe attaching portion 7 includes a pipe assembly 8 attached to the pipe attaching portion 7. The first fan 100a and the second fan 100b take in air outside the blower main body 6 and discharge it in the same direction from the pipe attaching portion 7.

The pipe assembly 8 includes first to fifth partial pipes (or first to fifth pipe segments) 8a to 8e. The first partial pipe 8a is formed in an L shape and is removably attached to the pipe attaching portion 7. The second partial pipe 8b is formed in a bellows-like shape and configured to be connected to the first partial pipe 8a. The third partial pipe 8c is formed into a linear shape and configured to be connected to the second partial pipe 8b. The third partial pipe 8c is configured to be connected to the fourth partial pipe 8d or the fifth partial pipe 8e. The fourth partial pipe 8d is formed in a linear shape. The fifth partial pipe 8e is formed into a linear shape and includes a discharge port 9 on the tip thereof. The discharge port 9 has a diameter smaller than a diameter of the rear end of the fifth partial pipe 8e. The fifth partial pipe 8e can also be connected to the tip of the fourth partial pipe 8d.

The third partial pipe 8c includes a handle 20 provided thereon. The handle 20 is configured to be gripped by the user. The handle 20 includes various switches, a lock button 26, and the manual controller 30. The various switches, the lock button 26 and the manual controller 30 are manually operated by the user.

The various switches include a trigger switch 22 and a dial switch 24. The trigger switch 22 is configured to be pulled by the user to adjust a discharge amount of the air from the blower 2. The dial switch 24 is configured to be turned by the user to set a maximum discharge amount that can be adjusted by the trigger switch 22. The lock button 26 is configured to be pressed by the user to hold the trigger switch 22 in a maximally pulled position. In response to the lock button 26 pressed, the trigger switch 22 is fixed in the maximally pulled position. In response to the lock button 26 pressed again, the trigger switch 22 is released from the maximally pulled position. The trigger switch 22, the dial switch 24, the lock button 26, and the manual controller 30 are electrically connected to the driving controller 120 through a cable 32.

1-2. Structure of Manual Controller

Figure 3:
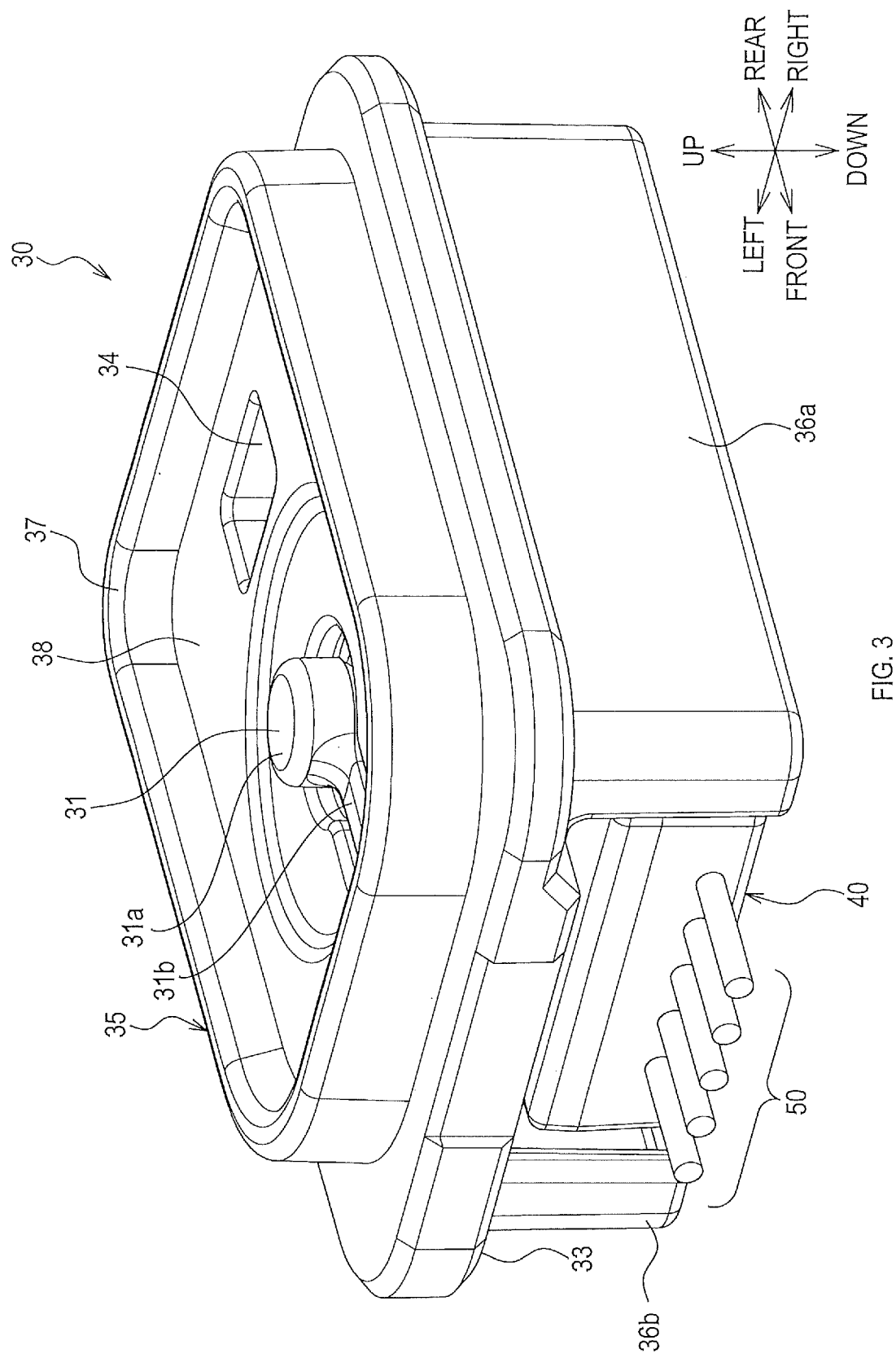
FIG. 3 is a perspective view showing an external appearance of a manual controller of the backpack-type blower.

With reference to FIGS. 3 to 12, details of the structure of the manual controller 30 will be described. As shown in FIG. 3, the manual controller 30 has a substantially rectangular parallelepiped shape.

The manual controller 30 includes a cover 35. The cover 35 is made of a resin. The cover 35 includes an upper surface 38, a wall portion 37, a collar portion 33, a right holder 36a and a left holder 36b. The upper surface 38 is formed into a substantially rectangular shape. The upper surface 38 includes an operated member 31 and a window 34. The operated member 31 is configured to be pressed by the user to start the blower 2 (more specifically to start the driving controller 120). More specifically, the operated member 31 is provided in a front area of the upper surface 38. The operated member 31 includes a circular member 31a and a rectangular member 31b. The rectangular member 31b includes a first end connected to the upper surface 38. The rectangular member 31b also includes a second end opposite to the first end. This second end is connected to the circular member 31a. There is a gap between a periphery of the operated member 31 and the upper surface 38, except a boundary between the first end of the operated member 31 and the upper surface 38. That is, the operated member 31 is supported by the first end so that the operated member 31 can be vertically displaced. The window 34 is provided in a rear area of the upper surface 38. In this first embodiment, the window 34 is in the form of a square-formed hole, but the window 34 is not limited to this form.

The wall portion 37 surrounds the upper surface 38 and protrudes upward from the upper surface 38. The collar portion 33 protrudes into a lengthwise direction and a widthwise direction of the manual controller 30 from the bottom end of the wall portion 37. The lengthwise direction corresponds to a direction from the front side to the rear side of the manual controller 30 or a direction from the rear side to the front side of the manual controller 30. The widthwise direction corresponds to a direction from the right side to the left side of the manual controller 30 or a direction from the left side to the right side of the manual controller 30.

The right holder 36a and the left holder 36b protrude downward from the undersurface of the collar portion 33. The right holder 36a extends in the lengthwise direction along the right part of the collar portion 33. The right holder 36a includes a front end and a rear end bending toward the left side. The left holder 36b extends in the lengthwise direction along the left part of the collar portion 33. The left holder 36b includes a front end and a rear end bending toward the right side.

The manual controller 30 includes a main body 40. The main body 40 is placed under the collar portion 33. The right end and the left end of the main body 40 are respectively held by the right holder 36a and the left holder 36b.

Figure 11:
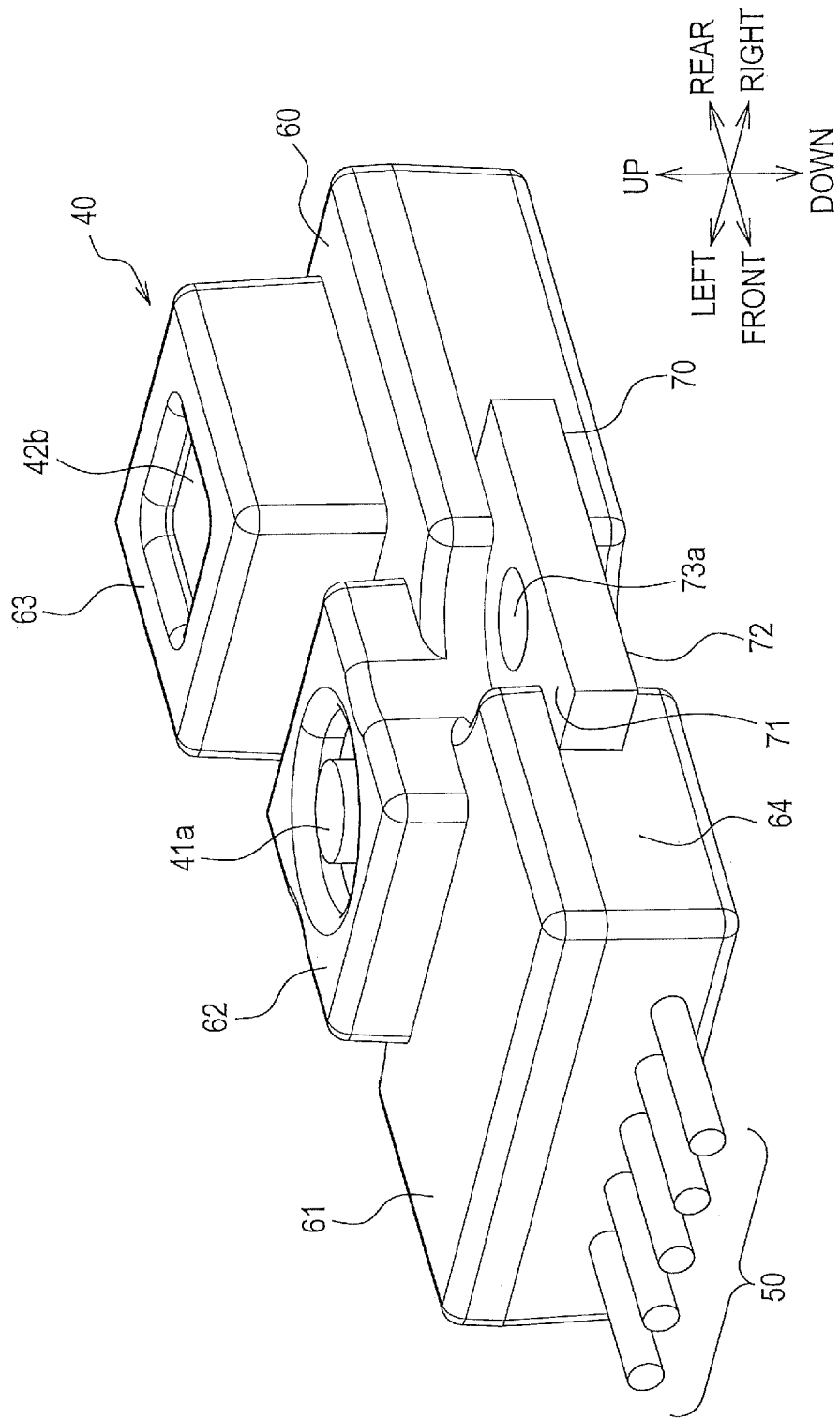
FIG. 11 is a perspective view showing the circuit board covered with the resin member.

As shown in FIG. 11, the main body 40 has a substantially rectangular parallelepiped shape. The main body 40 includes a circuit board 70 and a resin member 60.

Figure 4:
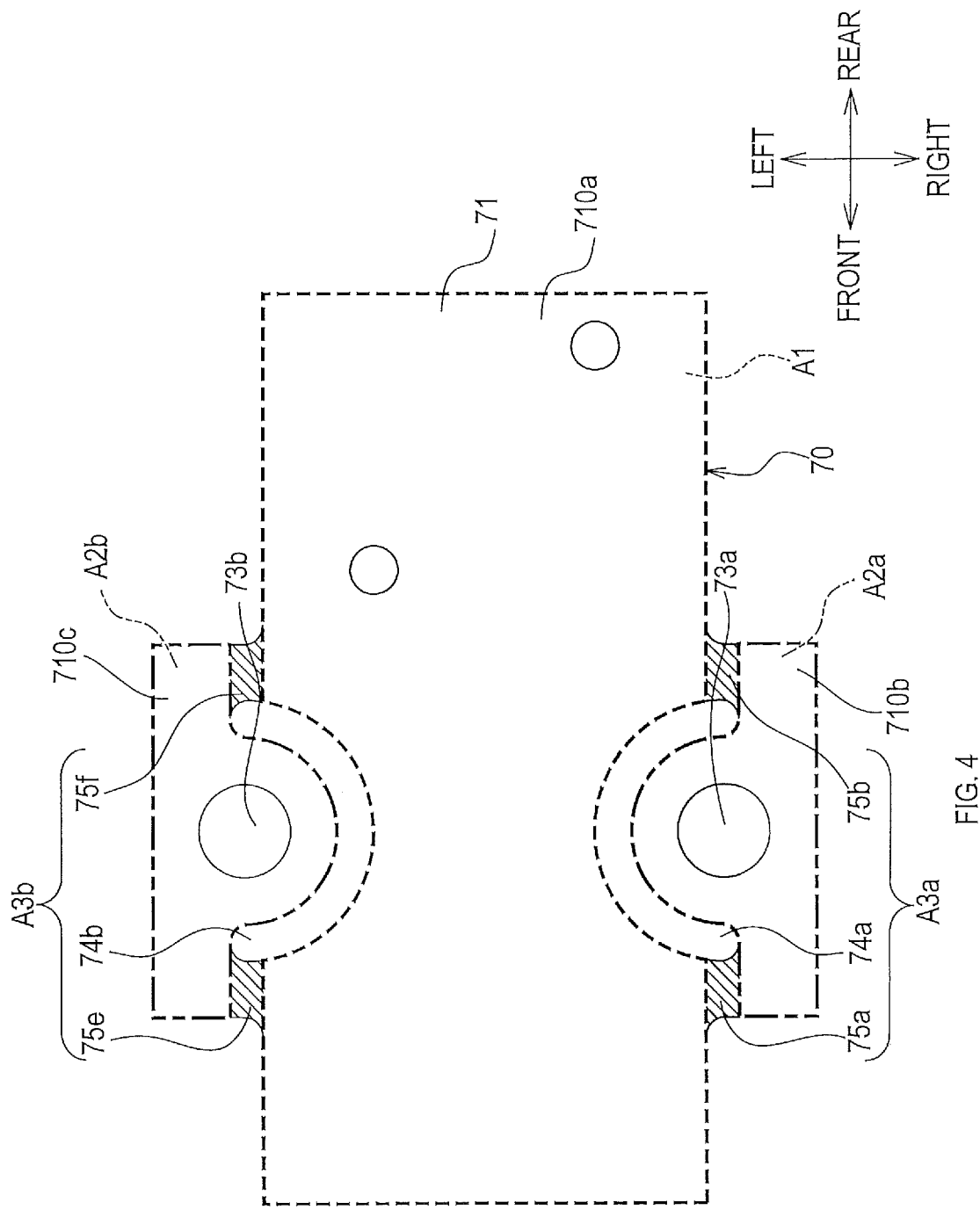
FIG. 4 is a plan view showing an upper surface of a circuit board in the manual controller.
Figure 5:
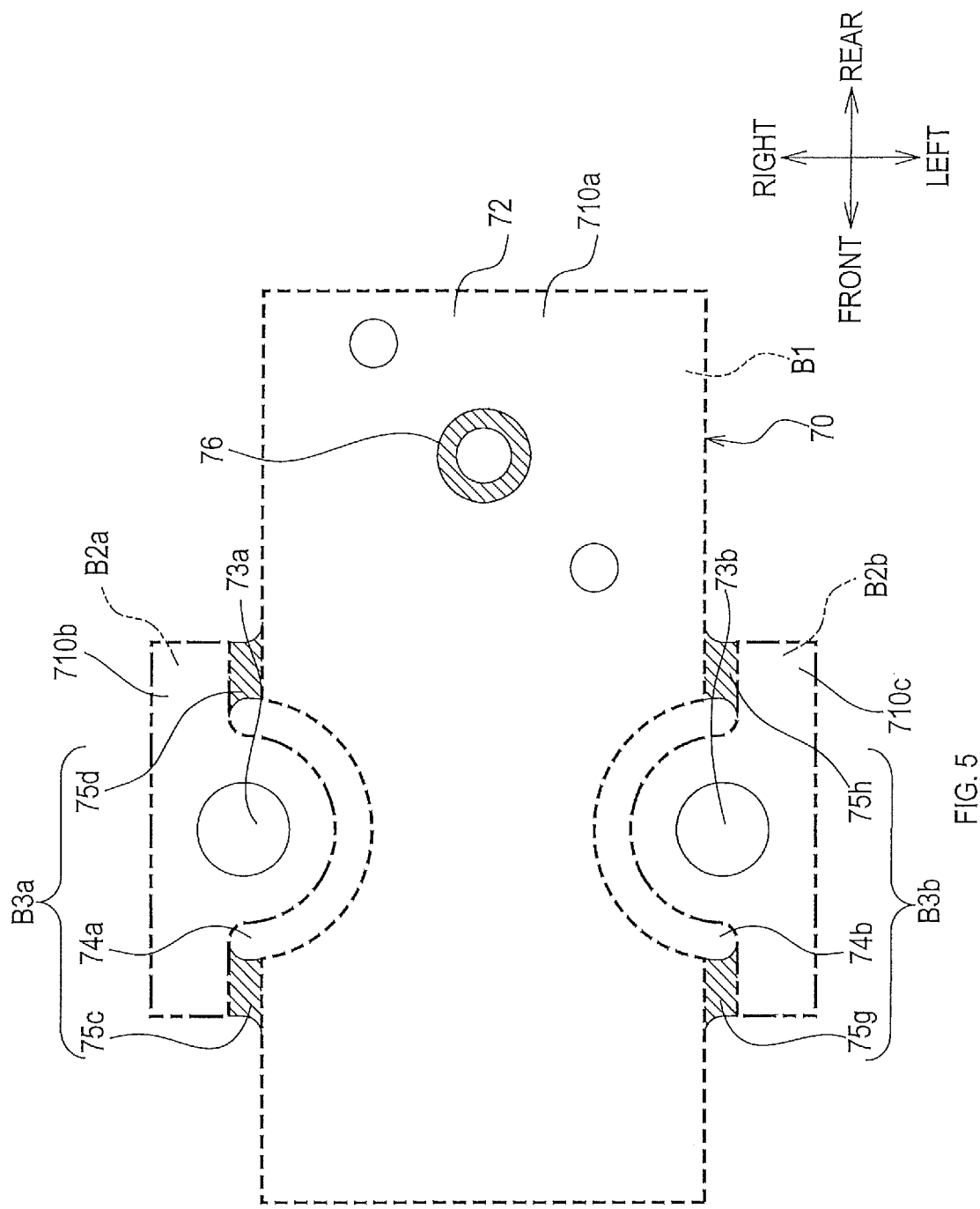
FIG. 5 is a plan view showing a lower surface of the circuit board.

The circuit board 70 is a printed circuit board (PCB). Examples of a material of the circuit board 70 (or a material of a surface of the circuit board 70) include a synthetic resin, such as a phenol resin, an epoxy resin, a polyimide resin, and the like. As shown in FIGS. 4 and 5, the circuit board 70 has a cross shape, and includes a rectangular part 710a, a right quadrangle part 710b, and a left quadrangle part 710c. Each of the rectangular part 710a, the right quadrangle part 710b and the left quadrangle part 710c extends along the lengthwise direction. The right quadrangle part 710b is connected to the right end of the rectangular part 710a. The left quadrangle part 710c is connected to the left end of the rectangular part 710a. In the first embodiment, the right quadrangle part 710b and the left quadrangle part 710c are the same in shape and size. In another embodiment, the right quadrangle part 710b and the left quadrangle part 710c may be different in shape and/or size.

As shown in FIG. 4, the circuit board 70 has an upper surface (or a top surface) 71. The upper surface 71 includes an upper middle area A1, an upper right-side area A2a, an upper left-side area A2b, an upper right-side boundary area A3a and an upper left-side boundary area A3b. The upper middle area A1 is shown by a broken line in FIG. 4 and corresponds to the rectangular part 710a. The upper right-side area A2a and the upper left-side area A2b are shown by dot-dash-lines in FIG. 4 and the upper right-side area A2a and the upper left-side area A2b correspond to the right quadrangle part 710b and the left quadrangle part 710c, respectively. That is, the upper right-side area A2a is located on the right side of the upper middle area A1. The upper left-side area A2b is located on the left side of the upper middle area A1. The upper right-side boundary area A3a is located in a boundary between the upper middle area A1 and the upper right-side area A2a. The upper left-side boundary area A3b is located in a boundary between the upper middle area A1 and the upper left-side area A2b. The upper middle area A1 is covered with the resin member 60.

As shown in FIG. 5, the circuit board 70 has a lower surface (or a bottom surface) 72. The lower surface 72 includes a lower middle area B1, a lower right-side area B2a, a lower left-side area B2b, a lower right-side boundary area B3a and a lower left-side boundary area B3b. The lower middle area B1 is shown by a broken line in FIG. 5 and corresponds to the rectangular part 710a. The lower right-side area B2a and the lower left-side area B2b are shown by dot-dash-lines in FIG. 5 and correspond to the right quadrangle part 710b and the left quadrangle part 710c, respectively. That is, the lower right-side area B2a is located on the right side of the lower middle area B1. The lower left-side area B2b is located on the light side of the lower middle area B1. The lower right-side boundary area B3a is located in a boundary between the lower middle area B1 and the lower right-side area B2a. The lower left-side boundary area B3b is located in a boundary between the lower middle area B1 and the lower left-side area B2b. The lower middle area B1, the lower right-side area B2a, the lower left-side area B2b, the lower right-side boundary area B3a, and the lower left-side boundary area B3b are congruent with the upper middle area A1, the upper right-side area A2a, the upper left-side area A2b, the upper right-side boundary area A3a, and the upper left-side boundary area A3b, respectively.

The lower middle area B1 includes a lower adhesive joint 76 formed in the rear area thereof. The lower adhesive joint 76 has an annular shape. The lower middle area B1 is covered with a resist except for the lower adhesive joint 76. That is, the resist is removed from the lower adhesive joint 76.

The upper right-side area A2a, the upper left-side area A2b, the lower right-side area B2a, and the lower left-side area B2b do not include components mounted thereon and are not covered with the resin member 60. The upper right-side area A2a and the lower right-side area B2a include a right-side screw hole 73a formed therein. The upper left-side area A2b and the lower left-side area B2b include a left-side screw hole 73b formed therein. Each of the right-side screw hole 73a and the left-side screw hole 73b has a circular shape and penetrates through the circuit board 70. The right-side screw hole 73a is aligned with the left-side screw hole 73b in the widthwise direction.

The upper right-side boundary area A3a and the lower right-side boundary area B3a include a right-side slit 74a penetrating through the circuit board 70. The upper left-side boundary area A3b and the lower left-side boundary area B3b include a left-side slit 74b penetrating through the circuit board 70. Each of the right-side slit 74a and the left-side slit 74b has a semicircular arc shape centered on the right-side screw hole 73a or the left-side screw hole 73b. The semicircular arc has an arc length corresponding to a half of the circumference. That is, the right-side slit 74a is formed so that its arc is positioned on the left and its chord is positioned on the right. The left-side slit 74b is formed so that its arc is positioned on the right and its chord is positioned on the left. The right-side slit 74a is aligned with the left-side slit 74b in the widthwise direction.

As shown in FIG. 4, the upper right-side boundary area A3a includes a first adhesive joint 75a and a second adhesive joint 75b. Each of the first adhesive joint 75a and the second adhesive joint 75b has a quadrangle shape, and has a width approximately the same as the width of the right-side slit 74a. The first adhesive joint 75a extends forward from the front end of the right-side slit 74a. The second adhesive joint 75b extends backward from the rear end of the right-side slit 74a. As shown in FIG. 5, the lower right-side boundary area B3a is similar to the upper right-side boundary area A3a. That is, the lower right-side boundary area B3a includes a third adhesive joint 75c and a fourth adhesive joint 75d behind the first adhesive joint 75a and the second adhesive joint 75b, respectively.

Similarly, as shown in FIG. 4, the upper left-side boundary area A3b includes a fifth adhesive joint 75e and an sixth adhesive joint 75f. Each of the fifth adhesive joint 75e and the sixth adhesive joint 75f has a quadrangle shape, and has a width approximately the same as the width of the left-side slit 74b. The fifth adhesive joint 75e extends forward from the front end of the left-side slit 74b. The sixth adhesive joint 75f extends backward from the rear end of the left-side slit 74b. As shown in FIG. 5, the lower left-side boundary area B3b is similar to the upper left-side boundary area A3b. That is, the lower left-side boundary area B3b includes a seventh adhesive joint 75g and an eighth adhesive joint 75h behind the fifth adhesive joint 75e and the sixth adhesive joint 75f, respectively.

As shown in FIG. 4, the upper surface 71 is covered with a resist except for the first adhesive joint 75a, the second adhesive joint 75b, the fifth adhesive joint 75e and the sixth adhesive joint 75f. That is, as is the case of the lower adhesive joint 76, the resist is removed from the first adhesive joint 75a, the second adhesive joint 75b, the fifth adhesive joint 75e and the sixth adhesive joint 75f and these are not covered with the resist. As shown in FIG. 5, the lower surface 72 is covered with a resist except for the lower adhesive joint 76, the third adhesive joint 75c, the fourth adhesive joint 75d, the seventh adhesive joint 75g and the eighth adhesive joint 75h. Examples of materials of the resist on the upper surface 71 and the resist on the lower surface 72 include a polymer, such as epoxy, a photosensitive polymer, and the like.

Figure 6:
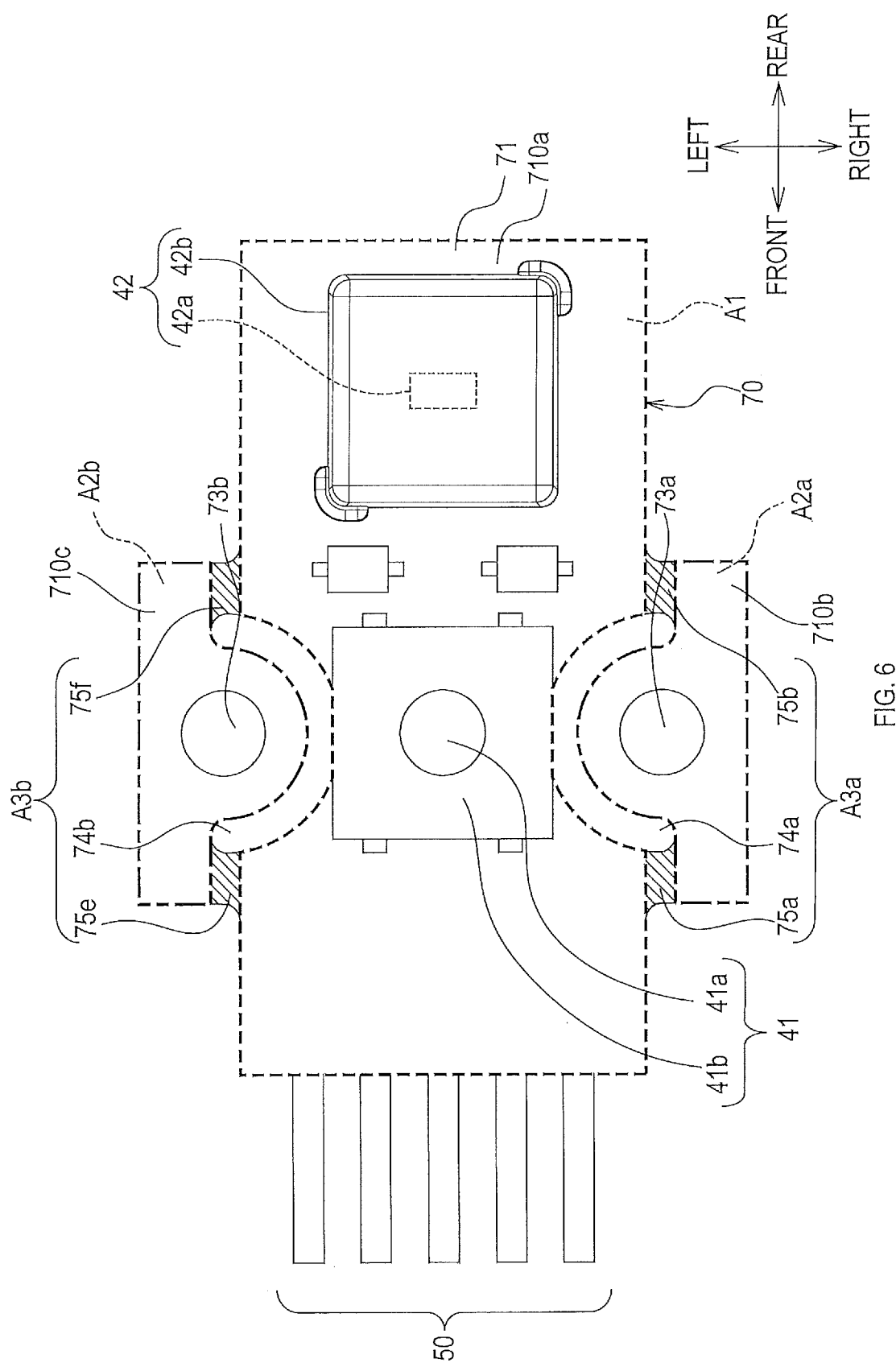
FIG. 6 is a plan view showing the upper surface with a main power switch and an indicator mounted thereon.
Figure 8:
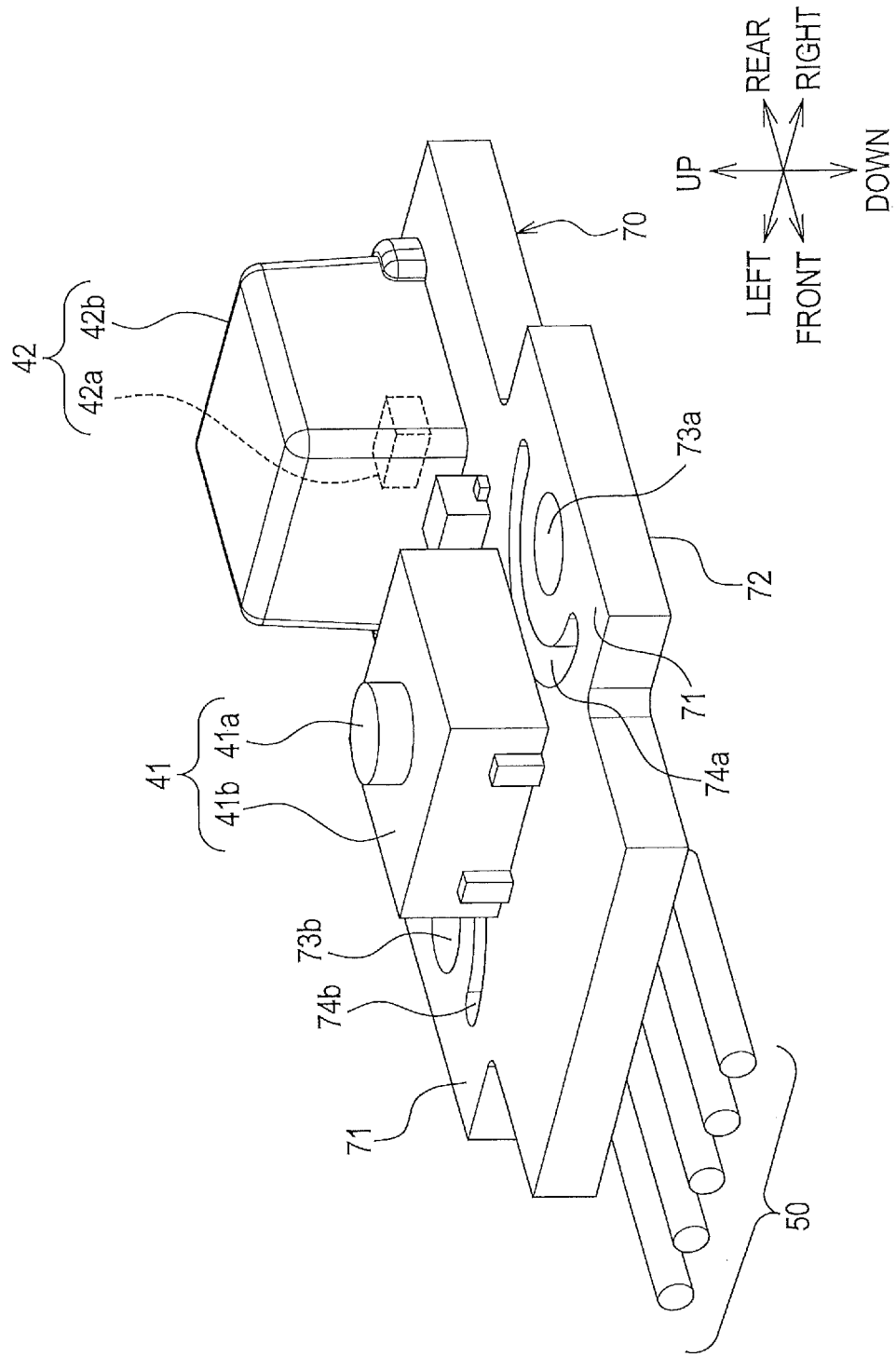
FIG. 8 is a perspective view showing the circuit board with the main power switch, the indicator and the lead wires thereon.

As shown in FIGS. 6 and 8, the upper middle area A1 includes a main power switch 41 and an indicator 42 mounted thereon. Each of the main power switch 41 and the indicator 42 correspond to an example of the electronic component of the present disclosure. The main power switch 41 is mounted in an approximate center of the upper middle area A1. Specifically, the main power switch 41 is placed between the right-side slit 74a and the left-side slit 74b.

The main power switch 41 is in the form of a tactile switch in this first embodiment. The main power switch 41 includes a push button 41a and a base part 41b. The push button 41a has a columnar shape. The base part 41b has a rectangular parallelepiped shape. The push button 41a and the base part 41b are formed of a resin material, such as a liquid crystal polymer. The main power switch 41 is not limited to the tactile switch, and may be any switch mountable to the circuit board 70, such as a membrane switch, a rotary switch, and a dual in-line package (DIP) switch.

The push button 41a is attached on the upper surface of the base part 41b so as to be displaceable in a vertical direction. The vertical direction corresponds to a direction from the upper side to the lower side of the circuit board 70 or a direction from the lower side to the upper side of the circuit board 70. When the main body 40 is attached to the cover 35, the push button 41a is arranged right under the circular member 31a of the operated member 31. In response that a user presses the circular member 31a, the circular member 31a and the push button 41a are displaced downward. In response that the user releases the circular member 31a, the circular member 31a and the push button 41a are displaced upward and return to the original position.

The indicator 42 functions to alarm a status of the blower 2. The indicator 42 is arranged in the rear area of the upper middle area A1. The indicator 42 includes a light-emitting device (LED) 42a and a lens 42b. The lens 42b is formed into a rectangular parallelepiped shape and has an opening in the bottom thereof. The lens 42b is a transparent lens allowing light emitted from the LED 42a to pass through.

The "transparent lens" here means any lens transmitting light regardless of the presence or absence of color. That is, the lens 42b is not limited to a transparent and colorless lens and may be a colored lens allowing light to pass through. The lens 42b houses the LED 42a in the internal space thereof and surrounds the LED 42a.

Figure 7:
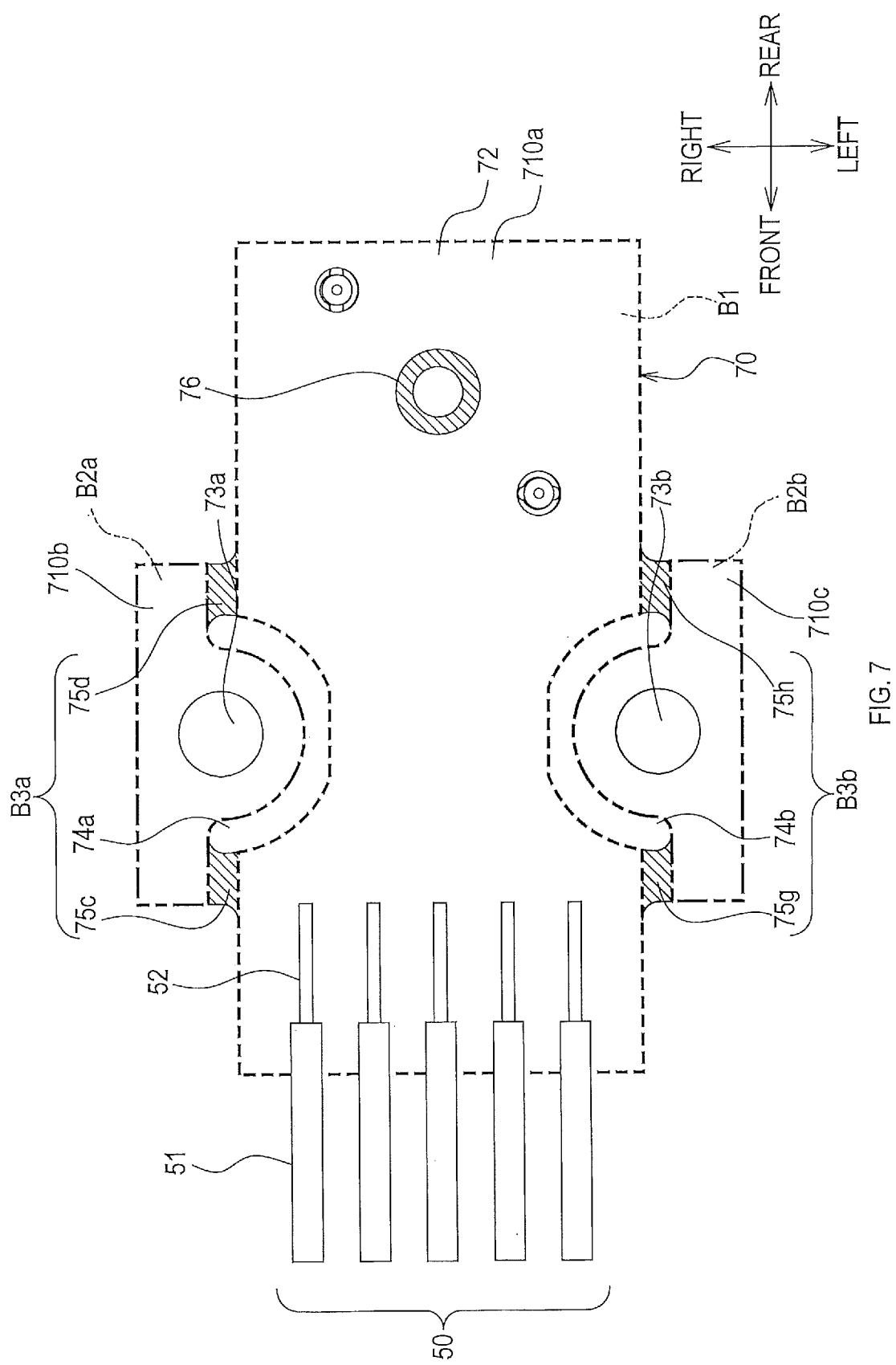
FIG. 7 is a plan view showing the lower surface with lead wires connected thereto.

As shown in FIG. 7, the lower middle area B1 is connected to two or more (e.g., five) lead wires 50. These lead wires 50 include a lead wire transmitting a signal from the main power switch 41 and other lead wire(s) supplying electric power to the LED 42a. Each of these lead wires 50 includes a cover 51 and a core wire 52. The core wire 52 is a metal core wire that is not covered with an insulator, and the core wire 52 is soldered to the lower surface 72. The core wire 52 is connected to one of two or more terminals of the main power switch 41 and the LED 42a through one of two or more through holes (not shown) provided in the lower surface 72. These through holes are copper foiled, soldered and copper plated. The lower adhesive joint 76 is provided at a position corresponding to the indicator 42.

In a manufacturing process of the main body 40, the circuit board 70 with the main power switch 41, the indicator 42 and the two or more lead wires 50 connected thereto is placed and held in a mold. More specifically, the upper right-side area A2a, the upper left-side area A2b, the lower right-side area B2a and the lower left-side area B2b are held by the mold, and a circular portion inside the lower adhesive joint 76 is supported from below. In this state, a resin material, such as polyamide is injected into the mold. After the injected resin material is thermally cured, an integrally-molded resin member 60 is formed.

Figure 9:
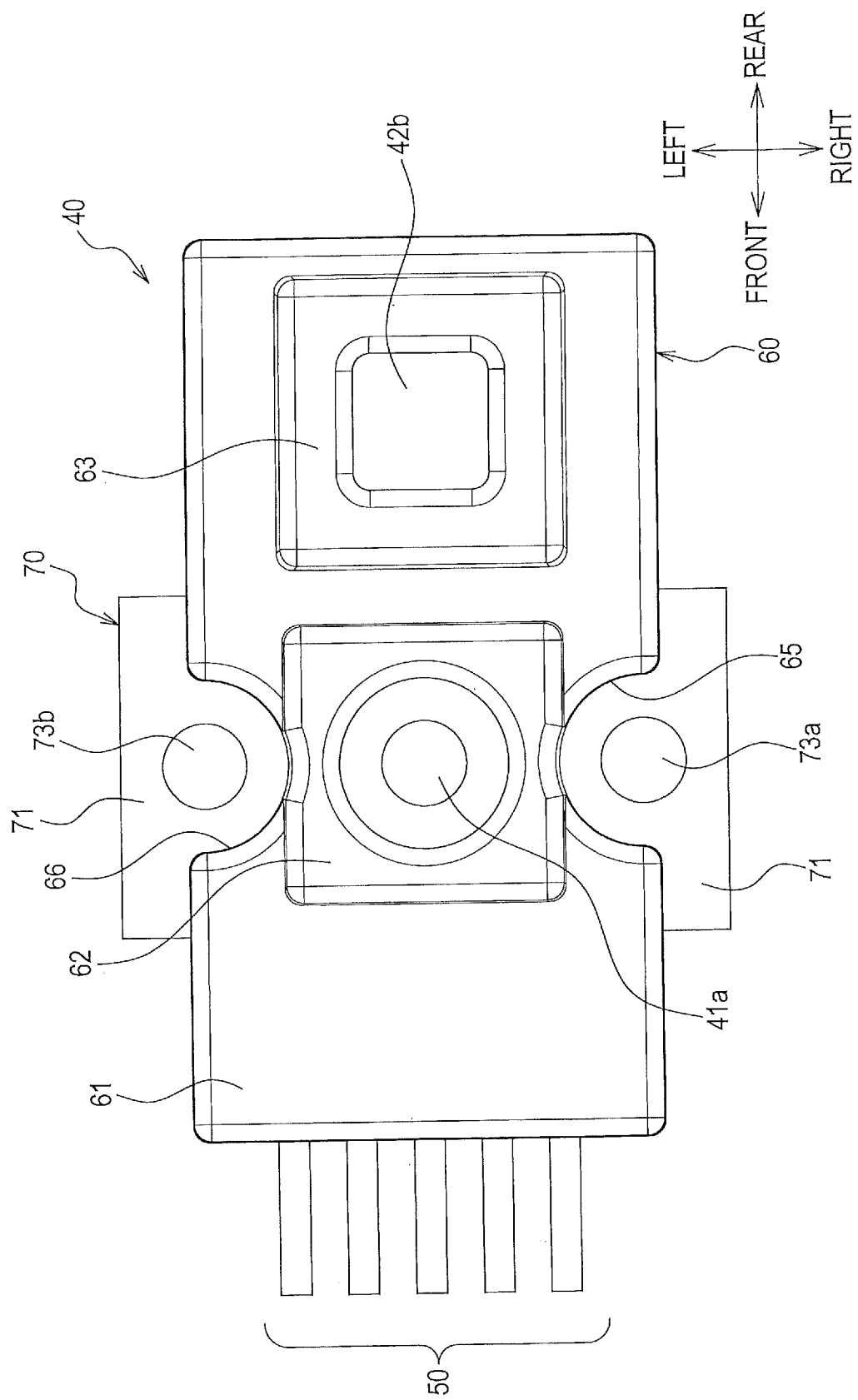
FIG. 9 is a plan view showing the upper surface of the circuit board covered with a resin member.
Figure 10:
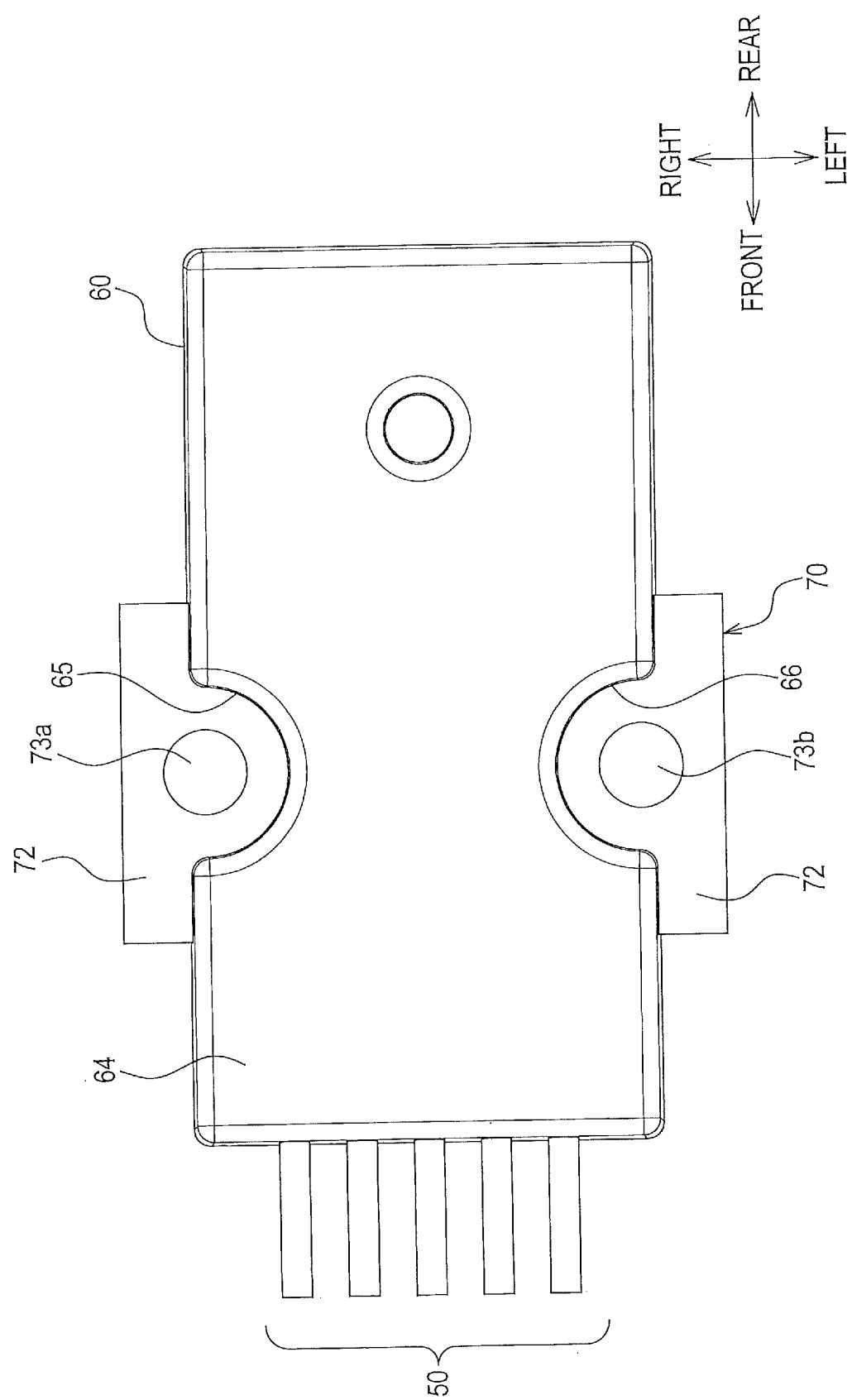
FIG. 10 is a plan view showing the lower surface of the circuit board covered with the resin member.

As a result, as shown in FIGS. 9 and 10, the upper right-side area A2a, the upper left-side area A2b, the lower right-side area B2a, the lower left-side area B2b and the circular portion inside the lower adhesive joint 76 are not covered with the resin member 60. The resin member 60 covers the upper middle area A1, the lower middle area B1, a part of the main power switch 41, a part of the indicator 42 and a part of the two or more lead wires 50.

The resin member 60 includes a first cover 61, a second cover 62, a third cover 63, a fourth cover 64, a fifth cover 65 and a sixth cover 66.

The first cover 61 covers a non-mounting part in the upper middle area A1, the first adhesive joint 75a, the second adhesive joint 75b, the fifth adhesive joint 75e and the sixth adhesive joint 75f in the upper surface 71. The non-mounting part corresponds to a part in which the main power switch 41 and the indicator 42 are not mounted thereon.

The second cover 62 covers around the main power switch 41. The bottom end of the second cover 62 is connected to the first cover 61. The second cover 62 covers the side surfaces of the base part 41b and the edge of the upper surface of the base part 41b, and does not cover the push button 41a (see FIG. 11).

The third cover 63 covers the side surfaces of the lens 42b and the edge of the upper surface of the lens 42b and does not cover the central portion of the upper surface of the lens 42b. The bottom end of the third cover 63 is connected to the first cover 61. When the main body 40 is attached to the cover 35, the central portion of the upper surface of the lens 42b is arranged right under the window 34. As a result, the light emitted from the LED 42a is transmitted from the central portion of the upper surface of the lens 42b.

The fourth cover 64 covers the lower middle area B1 except for the inside of the lower adhesive joint 76, and also covers the third adhesive joint 75c, the fourth adhesive joint 75d, the seventh adhesive joint 75g, and the eighth adhesive joint 75h in the lower surface 72. The lower adhesive joint 76 is covered with the fourth cover 64. The front end of the fourth cover 64 is connected to the front end of the first cover 61. The two or more lead wires 50 protrude forward from the front end of the fourth cover 64. The rear end of the fourth cover 64 is connected to the rear end of the first cover 61.

The right end of the fourth cover 64 is connected to the right end of the first cover 61. The left end of the fourth cover 64 is connected to the left end of the first cover 61.

The fifth cover 65 penetrates through the right-side slit 74a in the vertical direction. The sixth cover 66 penetrates through the left-side slit 74b in the vertical direction. That is, the fifth cover 65 and the sixth cover 66 connect the first cover 61 and the second cover 62 to the fourth cover 64. Thus, all the edges of the upper middle area A1 and all the edges of the lower middle area B1 are completely covered with the resin member 60 and are not exposed from the resin member 60.

The resin member 60 is continuous except for the lower adhesive joint 76 and the portions corresponding to the first to eighth adhesive joints 75a to 75h, whereby boundaries between the resin member 60 and the circuit board 70 are not exposed. The resin member 60 is not continuous in the lower adhesive joint 76 and in the portions corresponding to the first to eighth adhesive joints 75a to 75h, whereby the boundaries between the resin member 60 and the circuit board 70 are exposed.

When the resin member 60 shrinks by heat curing, a gap may be generated between the resin member 60 and the circuit board 70. If such gap is generated between the resin member 60 and the circuit board 70 in the lower adhesive joint 76 and the first to eighth adhesive joints 75a to 75h, the liquid and the dust may enter the gap. Furthermore, the main power switch 41 is made of a resin material different from that of the resin member 60, and thus has a different thermal shrinkage. Therefore, due to the heat curing of the resin member 60, a gap may also be generated between the resin member 60 and the main power switch 41, and the liquid and the dust that enter the gap may go inside the main power switch 41. If the liquid and the dust go inside the main power switch 41, there is a possibility that the main power switch 41 fails and the blower 2 cannot be started.

In this first embodiment, the resin member 60 is adhered to the lower adhesive joint 76 and the first to eighth adhesive joints 75a to 75h without interposing the resist therebetween. Therefore, the adherence of the resin member 60 to the lower adhesive joint 76 and the first to eighth adhesive joints 75a to 75h is improved and the gap between the resin member 60 and the circuit board 70 is less likely to be generated.

Also, in this first embodiment, the resin member 60 penetrates through the right-side slit 74a provided in the upper right-side boundary area A3a and the lower right-side boundary area B3a. The resin member 60 also penetrates through the left-side slit 74b provided in the upper left-side boundary area A3b and the lower left-side boundary area B3b. As a result, the exposure of the boundary between the resin member 60 and the circuit board 70 is reduced. If the right-side slit 74a and/or the left-side slit 74b are not provided, the first cover 61 and the second cover 62 are not connected to the fourth cover 64 in an area/areas where the right-side slit 74a and/or the left-side slit 74b should have been provided. As a result, in such area/areas, the boundary between the resin member 60 and the circuit board 70 is exposed and the liquid and the dust can enter inside. In this first embodiment, the right-side slit 74a and the left-side slit 74b are provided, which reduces the exposure of the boundary between the resin member 60 and the circuit board 70 and which improves the waterproofness and the dust resistance of the main body 40.

Figure 12:
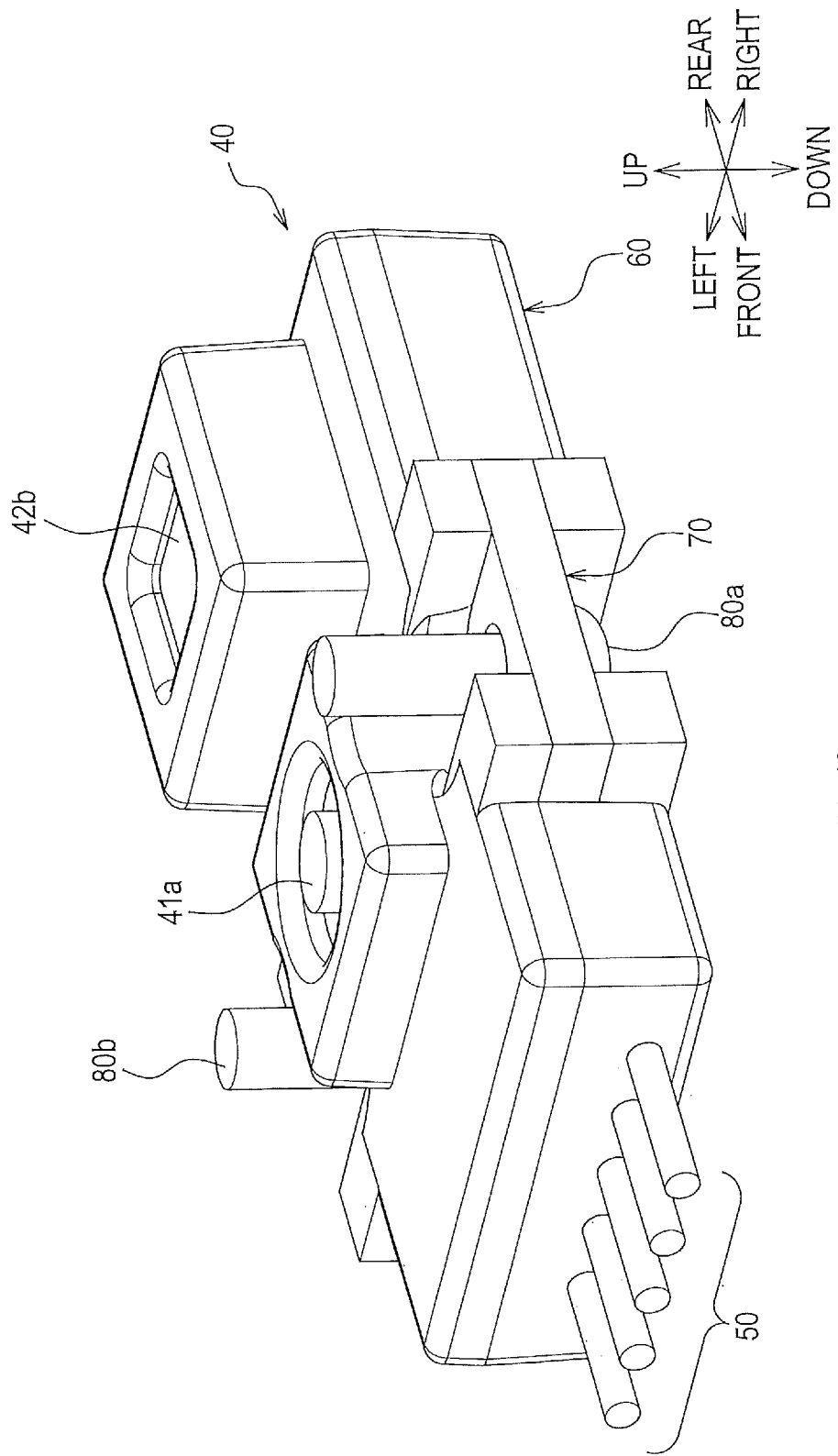
FIG. 12 is a perspective view showing the circuit board covered with the resin member, the circuit board having screws inserted into screw holes of the circuit board.

In the manual controller 30, the main body 40 is attached to the cover 35. As shown in FIG. 12, the main body 40 is attached to the cover 35 by a right-side tapping screw 80a and a left-side tapping screw 80b respectively inserted into the right-side screw hole 73a and the left-side screw hole 73b.

1-3. Effect

According to the first embodiment described above, the following first to fifth effects can be obtained.

The first effect: the resin member 60 penetrating through the right-side slit 74a and the left-side slit 74b can inhibit the exposure of the boundary between the resin member 60 and the circuit board 70. Therefore, the waterproofness and the dust resistance for the manual controller 30 can be improved.

The second effect: the right-side slit 74a formed in a semicircular arc shape can contribute to the effective use of the upper right-side area Ata and the lower right-side area B2a to provide the right-side screw hole 73a. Similarly, the left-side slit 74b formed in a semicircular arc shape can also contribute to the effective use of the upper left-side area A2b and the lower left-side area B2b to provide the left-side screw hole 73b.

The third effect: as described above, the right-side slit 74a and the left-side slit 74b each are formed into a semicircular arc form. Thus, the resin member 60 does not block the main body 40 to be screwed to the cover 35 and enables smooth screwing.

The fourth effect: the resin member 60 is adhered to the first to eighth adhesive joints 75a to 75h without interposing the resist therebetween. Therefore, the adherence of the resin member 60 to the first to eighth adhesive joints 75a to 75h is improved and the liquid and the dust can be further inhibited from entering the upper middle area A1 and the lower middle area B1.

The fifth effect: the two or more lead wires 50 are partially covered with the resin member 60 together with the lower middle area B1, and the two or more lead wires 50 protrude from the resin member 60 in the front end of the lower middle area B1, which is not on (or not adjacent to) the lower right-side boundary area B3a and the lower left-side boundary area B3b. Therefore, the two or more lead wires 50 can be pull out from the lower middle area B1 while inhibiting the liquid and the dust from entering the lower middle area B1.

Correspondences Between Terms

In the first embodiment, the upper surface 71 corresponds to an example of the first surface in the present disclosure. The lower surface 72 corresponds to an example of the second surface in the present disclosure. The upper middle area A1 corresponds to an example of the first area in the present disclosure. The upper right-side area A2a or the upper left-side area A1b corresponds to an example of the second area in the present disclosure. The upper right-side boundary area A3a or the upper left-side boundary area A3b corresponds to an example of the third area in the present disclosure. The lower middle area B1 corresponds to an example of the fourth area in the present disclosure. The lower right-side area B2a or the lower left-side area B2b corresponds to an example of the fifth area in the present disclosure. The lower right-side boundary area B3a or the lower left-side boundary area B3b corresponds to an example of the sixth area in the present disclosure. The first adhesive joint 75a, the second adhesive joint 75b, the fifth adhesive joint 75e, or the sixth adhesive joint 75f corresponds to an example of the first adhesive joint in the present disclosure. The third adhesive joint 75c, the fourth adhesive joint 75d, the seventh adhesive joint 75g, or the eighth adhesive joint 75h corresponds to an example of the second adhesive joint in the present disclosure. The front end of the circuit board 70 corresponds to an example of the non-adjacent end in the present disclosure. The front end of the resin member 60 corresponds to an example of the proximal end in the present disclosure. The rectangular part 710a corresponds to an example of the first quadrangle part in the present disclosure. The right quadrangle part 710b or the left quadrangle part 710c corresponds to an example of the second quadrangle part in the present disclosure. The left quadrangle part 710c or the right quadrangle part 710b corresponds to an example of the third quadrangle part in the present disclosure. The main power switch 41 corresponds to an example of the manual switch in the present disclosure. The push button 41a corresponds to an example of the manually operated portion in the present disclosure.

Second Embodiment

2-1. Difference from First Embodiment

The basic configuration of the second embodiment is similar to that of the first embodiment. Therefore, explanations of common configurations are omitted, and explanations focusing on differences will be provided. Reference numerals identical to those in the first embodiment indicate the same configurations in the first embodiment, and the preceding explanations should be referred to.

In the second embodiment, a circuit board 70A includes an upper right-side boundary area A3a, a lower right-side boundary area B3a, an upper left-side boundary area A3b and a lower left-side boundary area B3b as in the case of the circuit board 70 of the first embodiment. However, the circuit board 70A differs from the circuit board 70 of the first embodiment in that (i) the right-side slit 74a is not provided in the upper right-side boundary area A3a and the lower right-side boundary area B3a and (ii) the left-side slit 74b is not provided in the upper left-side boundary area A3b and the lower left-side boundary area B3b.

2-2. Configuration of Main Body

Figure 13:
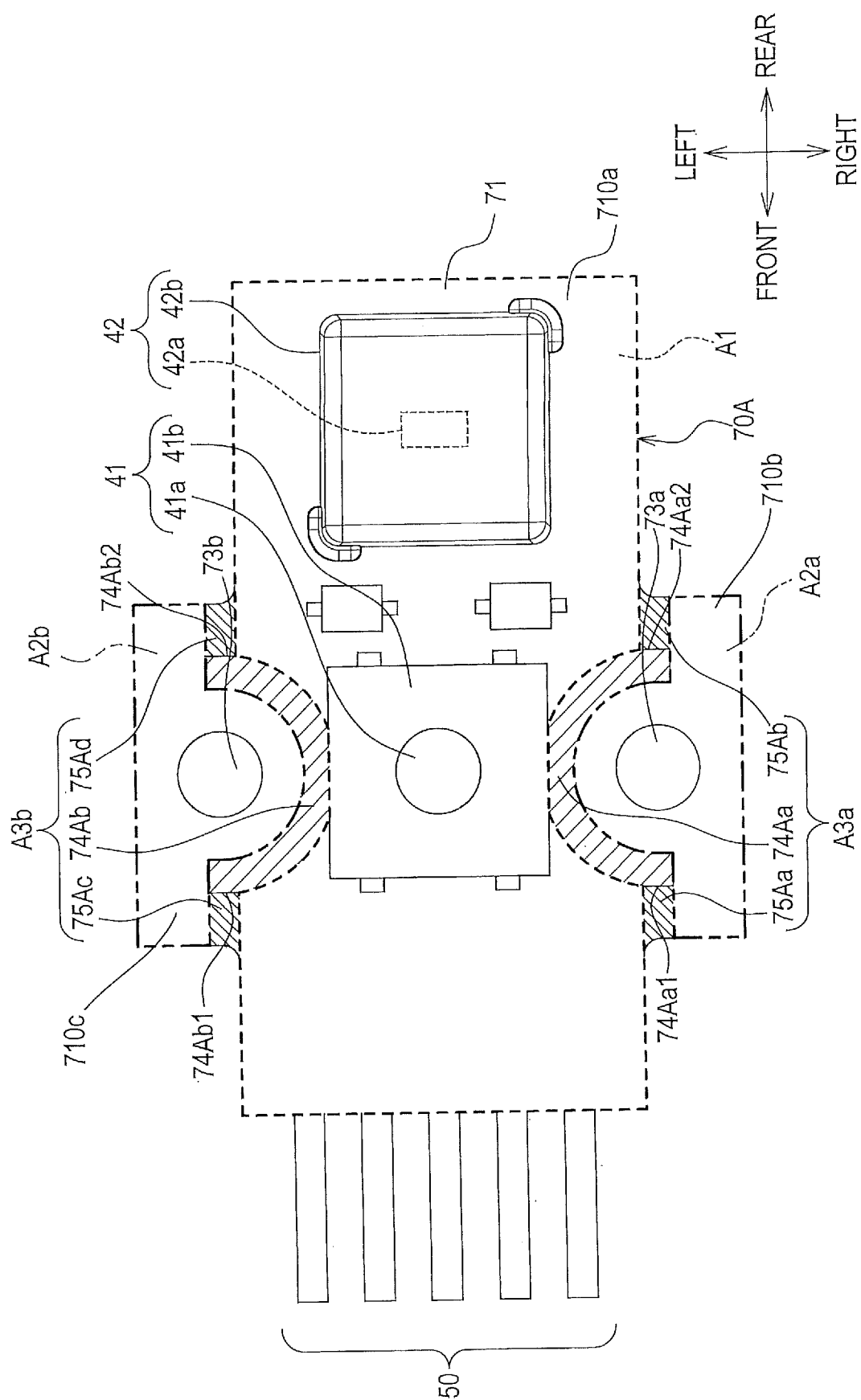
FIG. 13 is a plan view showing an upper surface of a circuit board according to a second embodiment, the upper surface having a main power switch and an indicator mounted thereon.
Figure 14:
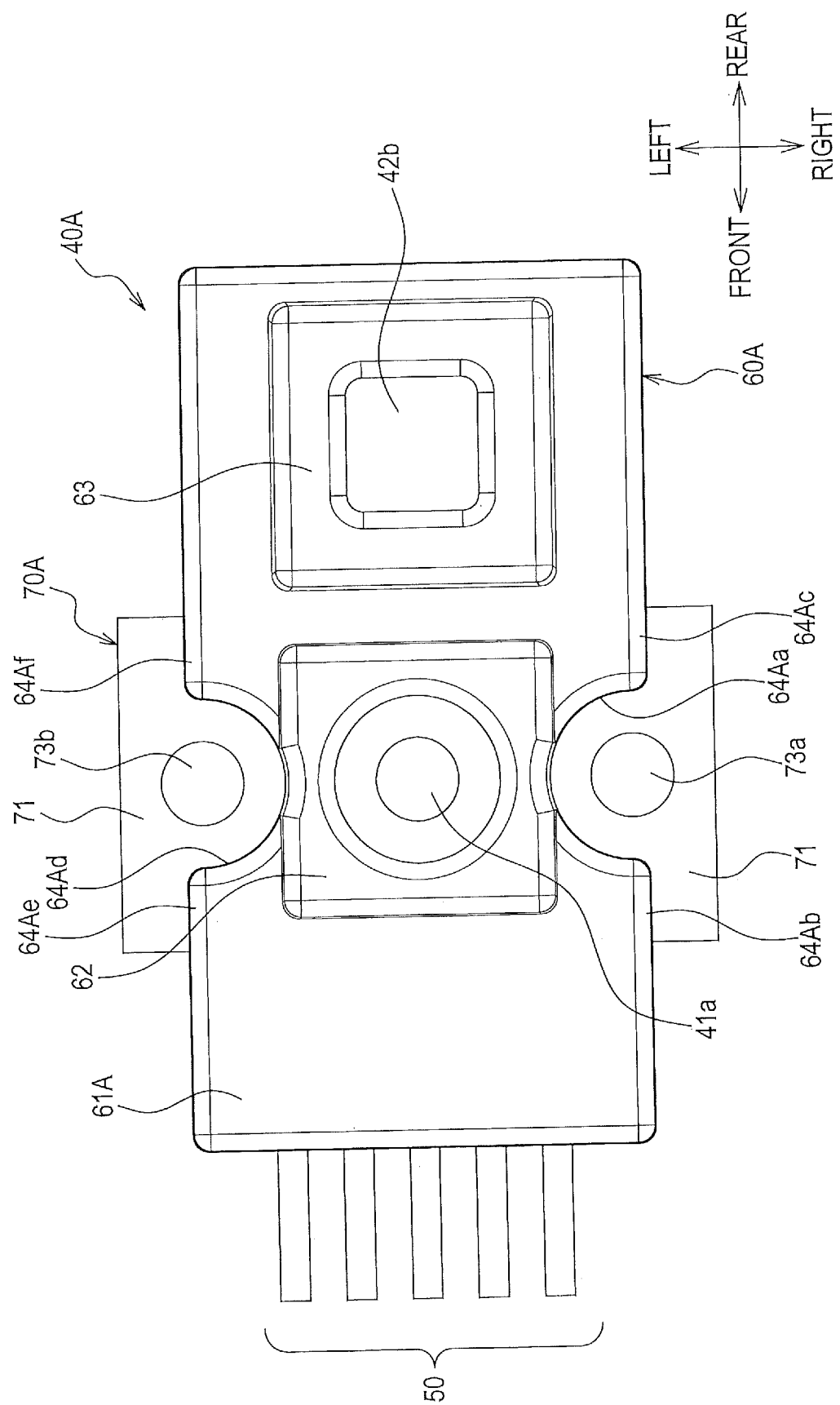
FIG. 14 is a plan view showing the upper surface of the circuit board according to the second embodiment, the upper surface being covered with a resin member.

With reference to FIGS. 13 and 14, the upper right-side boundary area A3a and the upper left-side boundary area A3b in the circuit board 70A will be described.

In this second embodiment, a resist is removed from the whole part of the upper right-side boundary area A3a and the whole part of the upper left-side boundary area A3b, and they are not covered with the resist.

As shown in FIG. 13, the upper right-side boundary area A3a includes a right circular arc area 74Aa, a first quadrangle area 75Aa and a second quadrangle area 75Ab. The upper left-side boundary area A3b includes a left circular arc area 74Ab, a third quadrangle area 75Ac and a fourth quadrangle area 75Ad.

The right circular arc area 74Aa has a semicircular arc shape centered on the right-side screw hole 73a. The left circular arc area 74Ab has a semicircular arc shape centered on the left-side screw hole 73b. That is, in the second embodiment, the right circular arc area 74Aa is provided at the position of the right-side slit 74a of the first embodiment, and the left-side circular arc area 74Ab is provided at the position of the left-side slit 74b of the first embodiment. The right circular arc area 74Aa includes a front end 74Aa1 and a rear end 74Aa2. The left circular arc area 74Ab includes a front end 74Ab1 and a rear end 74Ab2.

The first quadrangle area 75Aa has a quadrangle shape extending in the lengthwise direction from the front end 74Aa1 to the front end of the right quadrangle part 710b. The second quadrangle area 75Ab has a quadrangle shape extending in the lengthwise direction from the rear end 74Aa2 to the rear end of the right quadrangle part 710b. The third quadrangle area 75Ac has a quadrangle shape extending in the lengthwise direction from the front end 74Ab1 to the front end of the left quadrangle part 710c. The fourth quadrangle area 75Ad has a quadrangle shape extending in the lengthwise direction from the rear end 74Ab2 to the rear end of the left quadrangle part 710c.

As shown in FIG. 14, the resin member 60 includes a first cover 61A, a second cover 62, and a third cover 63 on the upper surface 71. The first cover 61A includes a first resin adhesive joint 64Aa, a second resin adhesive joint 64Ab, a third resin adhesive joint 64Ac, a fourth resin adhesive joint 64Ad, a fifth resin adhesive joint 64Ae and a sixth resin adhesive joint 64Af. The first cover 61A covers a part in which the main power switch 41 and the indicator 42 are not mounted on the middle area A1 and covers the upper right-side boundary area A3a and the upper left-side boundary area A3b.

The first resin adhesive joint 64Aa is adhered to the right circular arc area 74Aa. The second resin adhesive joint 64Ab is adhered to the first quadrangle area 75Aa. The third resin adhesive joint 64Ac is adhered to the second quadrangle area 75Ab. The fourth resin adhesive joint 64Ad is adhered to the left circular arc area 74Ab. The fifth resin adhesive joint 64Ae is adhered to the third quadrangle area 75Ac. The sixth resin adhesive joint 64Af is adhered to the fourth quadrangle area 75Ad. That is, the first cover 61A differs from the first cover 61 of the first embodiment in that the first resin adhesive joint 64Aa and the fourth resin adhesive joint 64Ad are added.

The first to sixth resin adhesive joints 64Aa to 64Af are formed along the edge of the resin member 60. Specifically, the first to sixth resin adhesive joints 64Aa to 64Af are formed along boundaries between the resin member 60A and the circuit board 70A. Therefore, the resin member 60A has improved adhesion to the circuit board 70A in the boundaries with the circuit board 70A.

On the other hand, in the lower surface 72, the resist may be entirely or partially removed from or applied to the lower middle area B1, the lower right-side area B2a, the lower left-side area B2b, the lower right-side boundary area B3a, and the lower left-side boundary area B3b. For example, as shown in FIG. 15, in the lower surface 72, the resist may be removed from the lower right-side boundary area B3a and the lower left-side boundary area B3b as in the case of the upper surface 71.

As shown in FIG. 16, the resin member 60 includes a fourth cover 64A. The fourth cover 64A covers the lower middle area B1, the lower right-side boundary area B3a and the lower left-side boundary area B3b in the lower surface 72, and is connected to the first cover 61A. That is, the fourth cover 64A is different from the fourth cover 64 of the first embodiment in that the fourth cover 64A has a first and a second semicircular arc parts 65A and 66A formed into shapes similar to the first resin adhesive joint 64Aa and the fourth resin adhesive joint 64Ad.

2-3. Effect

The above-described second embodiment can obtain the following sixth effect in addition to the second, third and fifth effects of the first embodiment.

The sixth effect: the adherence between the resin member 60A and the circuit board 70A is improved in the edge of the resin member 60A adjacent to the upper right-side area A2a and the upper left-side area A2b. Thus, the liquid and the dust can be inhibited from entering the main power switch 41 and the indicator 42. Consequently, the waterproofness and the dust resistance of the main body 40A can be improved.

2-4. Correspondences Between Terms

In this second embodiment, the upper surface 71 corresponds to an example of the first surface in the present disclosure, and the lower surface 72 corresponds to an example of the second surface in the present disclosure. The upper middle area A1 corresponds to an example of the first area in the present disclosure. The upper right-side area A2a or the upper left-side area A2b corresponds to an example of the second area in the present disclosure. The upper right-side boundary area A3a or the upper left-side boundary area A3b corresponds to an example of the third area in the present disclosure. The lower middle area B1 corresponds to an example of the fourth area in the present disclosure. The first resin adhesive joint 64Aa, the second resin adhesive joint 64Ab, the third resin adhesive joint 64Ac, the fourth resin adhesive joint 64Ad, the fifth resin adhesive joint 64Ae, or the sixth resin adhesive joint 64Af corresponds to an example of the resin adhesive joint in the present disclosure. The front end 74Aa1 or the front end 74Ab1 corresponds to an example of the first end in the present disclosure. The rear end 74Aa2 or the rear end 74Ab2 corresponds to an example of the second end in the present disclosure. The first quadrangle area 75Aa or the third quadrangle area 75Ac corresponds to an example of the first quadrangle area in the present disclosure. The second quadrangle area 75Ab or the fourth quadrangle area 75Ad corresponds to an example of the second quadrangle area in the present disclosure. The front end of the right quadrangle part 710b or the front end of the left quadrangle part 710c corresponds to an example of the first edge of the circuit board in the present disclosure. The rear end of the right quadrangle part 710b or the rear end of the left quadrangle part 710c corresponds to an example of the second edge of the circuit board in the present disclosure. The first resin adhesive joint 64Aa or the fourth resin adhesive joint 64Ad corresponds to an example of the first resin adhesive joint in the present disclosure. The second resin adhesive joint 64Ab or the fifth resin adhesive joint 64Ae corresponds to an example of the second resin adhesive joint in the present disclosure. The third resin adhesive joint 64Ac or the sixth resin adhesive joint 64Af corresponds to an example of the third resin adhesive joint in the present disclosure. The front end of the circuit board 70A corresponds to an example of the non-adjacent end in the present disclosure. The front end of the resin member 60A corresponds to an example of the proximal end in the present disclosure.

Other Embodiments

Although the embodiments for carrying out the present disclosure have been described above, the present disclosure is not limited to the above-described embodiments, and various modifications can be embodied.

First variation: electronic components mounted on the circuit board 70 or on the circuit board 70A is not limited to the main power switch 41 and the indicator 42. Such electronic component may be, for example, either one of the main power switch 41 and the indicator 42, and may be a switch different from the main power switch 41.

Second variation: the shape of the circuit board 70 or the circuit board 70A is not limited to a cross shape.

Third variation: the shape of each of the right-side slit 74a and the left-side slit 74b is not limited to a semicircular arc shape. For example, if the right-side screw hole 73a and/or the left-side screw hole 73b is/are not provided, the right-side slit 74a and/or the left-side slit 74b may have/has a linear shape.

Fourth variation: an example of a job-site gear according to the present disclosure is not limited to the blower 2 and includes any job-site gear that operates with direct-current power from a battery and that includes a circuit board and an electronic component. The present disclosure can be of great benefit especially when applied to a job-site gear for use outdoors.

Fifth variation: A plurality of functions of one element of the aforementioned embodiments may be performed by a plurality of elements, and one function of one element may be performed by a plurality of elements. Further, a plurality of functions of a plurality of elements may be performed by one element, and one function performed by a plurality of elements may be performed by one element. Further, a part of the configurations of the aforementioned embodiments may be omitted. Still further, at least a part of the configurations of the aforementioned embodiments may be added to or replaced with the configurations of the other above-described embodiments.

What is claimed is:

1. A job-site gear comprising:
a circuit board having a first surface and a second surface, wherein: the first surface includes a first area, a second area and a third area; the third area is between the first area and the second area; the second surface is behind the first surface; the second surface includes a fourth area, a fifth area, and a sixth area; the fourth area, the fifth area, and the sixth area are behind the first area, the second area, and the third area, respectively; and the third area and the sixth area include at least one slit penetrating through the circuit board;
at least one electronic component mounted on the first area; and
a resin member integrally molded so as to (i) penetrate through the at least one slit and (ii) cover the first area, the fourth area, and a part of the at least one electronic component with the second area and the fifth area extending out of the resin member such that the second area and the fifth area are not covered by the resin member.

2. The job-site gear according to claim 1,
wherein the fourth area, the fifth area, and the sixth area are congruent with the first area, the second area, and the third area, respectively.

3. The job-site gear according to claim 1,
wherein the second area and the fifth area include at least one screw hole penetrating through the circuit board.

4. A job-site gear comprising:
a circuit board having a first surface and a second surface, wherein: the first surface includes a first area, a second area and a third area; the third area is between the first area and the second area; the second surface is behind the first surface; the second surface includes a fourth area, a fifth area, and a sixth area; the fourth area, the fifth area, and the sixth area are behind the first area, the second area, and the third area, respectively; and the third area and the sixth area include at least one slit penetrating through the circuit board;
at least one electronic component mounted on the first area; and
a resin member integrally molded so as to (i) penetrate through the at least one slit and (ii) cover the first area, the fourth area, and a part of the at least one electronic component,
wherein the at least one slit has a semicircular arc shape.

5. The job-site gear according to claim 1,
wherein the circuit board includes:
a first quadrangle part having a first side part, the first quadrangle part including the first area and the fourth area; and
a second quadrangle part extending along the first side part, the second quadrangle part including the second area, the third area, the fifth area and the sixth area.

6. The job-site gear according to claim 5,
wherein the first quadrangle part includes a second side part, and
wherein the circuit board further includes a third quadrangle part extending along the second side part.

7. The job-site gear according to claim 6,
wherein the circuit board has a cross shape.

8. The job-site gear according to claim 4,
wherein the second area and the fifth area include at least one screw hole at a center of the semicircular arc shape, and
wherein the at least one screw hole penetrates through the circuit board.

9. A job-site gear comprising:
a circuit board having a first surface and a second surface, wherein: the first surface includes a first area, a second area and a third area; the third area is between the first area and the second area; the second surface is behind the first surface; the second surface includes a fourth area, a fifth area, and a sixth area; the fourth area, the fifth area, and the sixth area are behind the first area, the second area, and the third area, respectively; and the third area and the sixth area include at least one slit penetrating through the circuit board;
at least one electronic component mounted on the first area; and
a resin member integrally molded so as to (i) penetrate through the at least one slit and (ii) cover the first area, the fourth area, and a part of the at least one electronic component,
wherein the first area partially includes a first resist formed on the first surface,
wherein the second area partially includes a second resist formed on the second surface,
wherein the circuit board includes:
a first adhesive joint (i) that is provided in the third area and (ii) that does not include the first resist provided thereon; and
a second adhesive joint (i) that is provided in the sixth area and (ii) that does not include the second resist provided thereon, and wherein the resin member is adhered to the first adhesive joint and the second adhesive joint without interposing the first resist and the second resist therebetween.

10. A job-site gear comprising:
a circuit board having a first surface and a second surface, wherein: the first surface includes a first area, a second area and a third area; the third area is between the first area and the second area; the second surface is behind the first surface; the second surface includes a fourth area, a fifth area, and a sixth area; the fourth area, the fifth area, and the sixth area are behind the first area, the second area, and the third area, respectively; and the third area and the sixth area include at least one slit penetrating through the circuit board;
at least one electronic component mounted on the first area; and
a resin member integrally molded so as to (i) penetrate through the at least one slit and (ii) cover the first area, the fourth area, and a part of the at least one electronic component,
wherein the circuit board includes a non-adjacent end that is not on the third area,
wherein the resin member includes a proximal end to the non-adjacent end, and
wherein the job-site gear further includes a lead wire (i) that is electrically connected to the at least one electronic component, (ii) that has a portion covered with the resin member, and (iii) that protrudes from the proximal end.

11. A job-site gear comprising:
a circuit board having a first surface and a second surface, wherein: the first surface includes a first area, a second area and a third area; the third area is between the first area and the second area; the second surface is behind the first surface; the second surface includes a fourth area, a fifth area, and a sixth area; the fourth area, the fifth area, and the sixth area are behind the first area, the second area, and the third area, respectively; and the third area and the sixth area include at least one slit penetrating through the circuit board;
at least one electronic component mounted on the first area; and
a resin member integrally molded so as to (i) penetrate through the at least one slit and (ii) cover the first area, the fourth area, and a part of the at least one electronic component,
wherein the at least one electronic component includes a manual switch configured to be manually operated by a user of the job-site gear.

12. The job-site gear according to claim 11,
wherein the manual switch includes a manually operated portion configured to be manually operated by the user, and
wherein the manually operated portion is exposed from the resin member.

13. A job-site gear comprising:
a circuit board having a first surface and a second surface, wherein: the first surface includes a first area, a second area and a third area; the third area is between the first area and the second area; the second surface is behind the first surface; the second surface includes a fourth area, a fifth area, and a sixth area; the fourth area, the fifth area, and the sixth area are behind the first area, the second area, and the third area, respectively; and the third area and the sixth area include at least one slit penetrating through the circuit board;
at least one electronic component mounted on the first area;
a resin member integrally molded so as to (i) penetrate through the at least one slit and (ii) cover the first area, the fourth area, and a part of the at least one electronic component; and
a manual controller manually operated by a user of the job-site gear,
wherein the circuit board and the resin member are provided to the manual controller.

14. A method for manufacturing a job-site gear, the method comprising:
providing a circuit board having a first surface and a second surface, wherein: the first surface includes a first area, a second area and a third area; the third area is between the first area and the second area; the second surface is behind the first surface; the second surface includes a fourth area, a fifth area, and a sixth area; and the fourth area, the fifth area, and the sixth area are behind the first area, the second area, and the third area, respectively;
mounting at least one electronic component on the first area;
providing at least one slit in the third area and the sixth area, the at least one slit penetrating through the circuit board;
integrally molding a resin member so that (i) the resin member penetrates through the at least one slit and (ii) the resin member covers the first area, the fourth area, and a part of the at least one electronic component with the second area and the fifth area extending out of the resin member such that the second area and the fifth area are not covered by the resin member; and
providing to the job-site gear the circuit board with the resin member integrally molded.

* * * * *